(12) United States Patent
Murooka

(10) Patent No.: US 8,971,093 B2
(45) Date of Patent: Mar. 3, 2015

(54) MEMORY DEVICE AND METHOD OF CONTROLLING MEMORY DEVICE

(71) Applicant: Kabushiki Kaisha Toshiba, Minato-ku (JP)

(72) Inventor: Kenichi Murooka, San Jose, CA (US)

(73) Assignee: Kabushiki Kaisha Toshiba, Minato-Ku (JP)

( * ) Notice: Subject to any disclaimer, the term of this patent is extended or adjusted under 35 U.S.C. 154(b) by 0 days.

(21) Appl. No.: 14/025,146

(22) Filed: Sep. 12, 2013

(65) Prior Publication Data

US 2014/0340956 A1 Nov. 20, 2014

Related U.S. Application Data

(60) Provisional application No. 61/823,026, filed on May 14, 2013.

(51) Int. Cl.
*G11C 11/00* (2006.01)
*G11C 13/00* (2006.01)

(52) U.S. Cl.
CPC ................................. *G11C 13/0097* (2013.01)
USPC .......................................... 365/148; 365/222

(58) Field of Classification Search
USPC .................................................. 365/148, 222
See application file for complete search history.

(56) References Cited

U.S. PATENT DOCUMENTS

| | | | |
|---|---|---|---|
| 2005/0135155 A1 | 6/2005 | Ishimaru et al. | |
| 2011/0157959 A1 | 6/2011 | Terai | |
| 2012/0069626 A1* | 3/2012 | Nakano et al. | 365/148 |
| 2012/0147644 A1 | 6/2012 | Scheuerlein | |
| 2012/0147645 A1 | 6/2012 | Scheuerlein | |
| 2012/0147646 A1 | 6/2012 | Scheuerlein | |
| 2012/0147647 A1 | 6/2012 | Scheuerlein | |
| 2012/0147648 A1 | 6/2012 | Scheuerlein | |
| 2012/0147649 A1 | 6/2012 | Samachisa et al. | |
| 2012/0147650 A1 | 6/2012 | Samachisa et al. | |
| 2012/0147651 A1 | 6/2012 | Scheuerlein et al. | |
| 2012/0147652 A1 | 6/2012 | Scheuerlein | |
| 2012/0147689 A1 | 6/2012 | Scheuerlein et al. | |
| 2013/0148400 A1 | 6/2013 | Murooka | |
| 2013/0187118 A1 | 7/2013 | Murooka | |

FOREIGN PATENT DOCUMENTS

| | | |
|---|---|---|
| JP | 2005-182909 | 7/2005 |
| JP | 2006-253679 | 9/2006 |
| JP | 2010-170591 A | 8/2010 |
| WO | WO 2009/119533 | 10/2009 |

OTHER PUBLICATIONS

U.S. Appl. No. 14/156,595, filed Jan. 16, 2014, Murooka.
U.S. Appl. No. 14/284,516, filed May 22, 2014, Murooka.
U.S. Appl. No. 14/017,703, filed Sep. 4, 2013, Murooka.
U.S. Appl. No. 14/017,727, filed Sep. 4, 2013, Murooka.
U.S. Appl. No. 14/282,047, filed May 20, 2014, Murooka.

\* cited by examiner

*Primary Examiner* — Hoai V Ho
(74) *Attorney, Agent, or Firm* — Oblon, McClelland, Maier & Neustadt, L.L.P.

(57) ABSTRACT

According to one embodiment, a memory device includes a semiconductor layer connected between a first conductive line and one end of a third conductive line, resistance change elements connected between second conductive lines and the third conductive line respectively, a select FET having a select gate electrode, and using the semiconductor layer as a channel, and a control circuit executing a write/erase of at least one of the resistance change elements, and executing a recovering operation which adjusts a threshold voltage shift of the select FET after the write/erase.

20 Claims, 32 Drawing Sheets

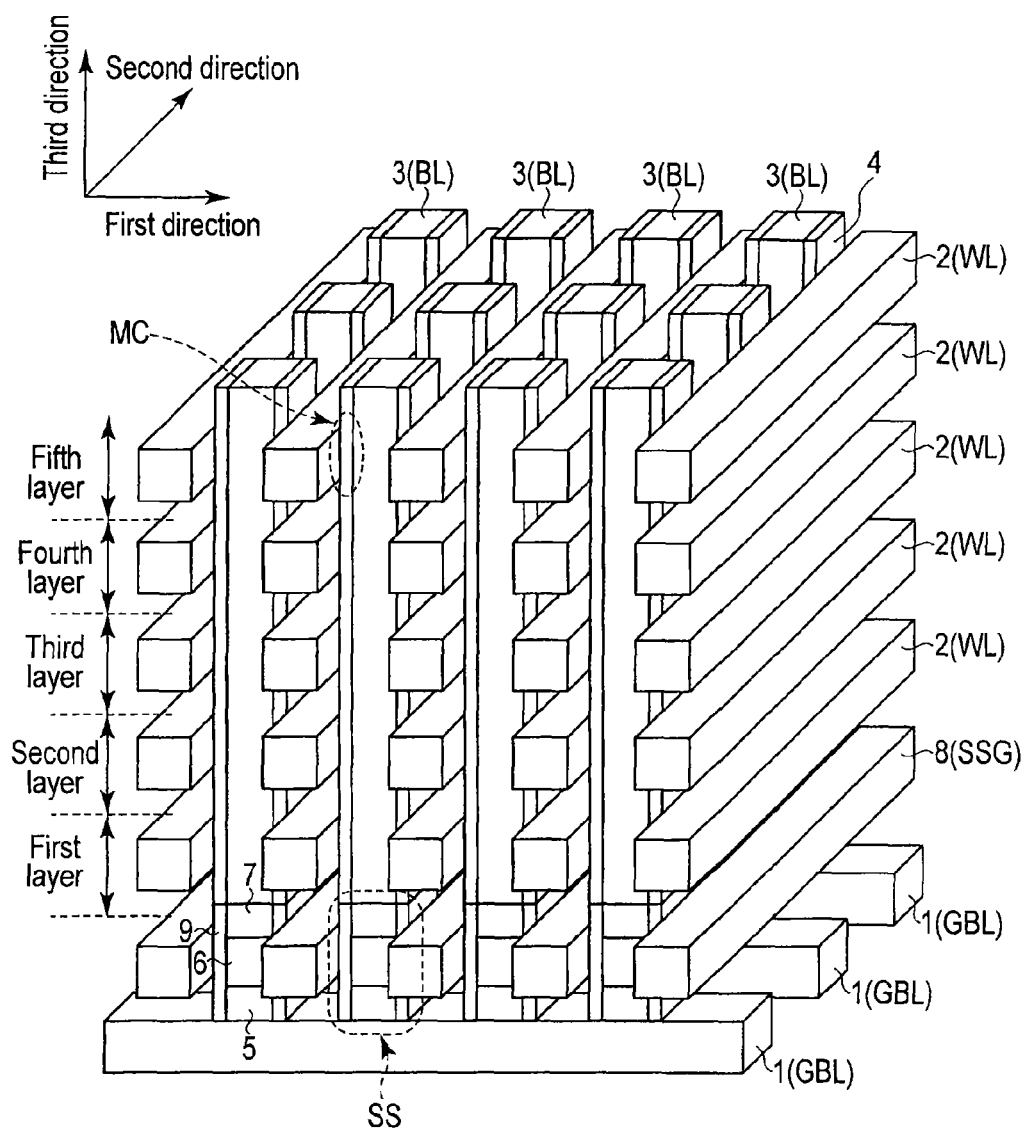
F I G. 1

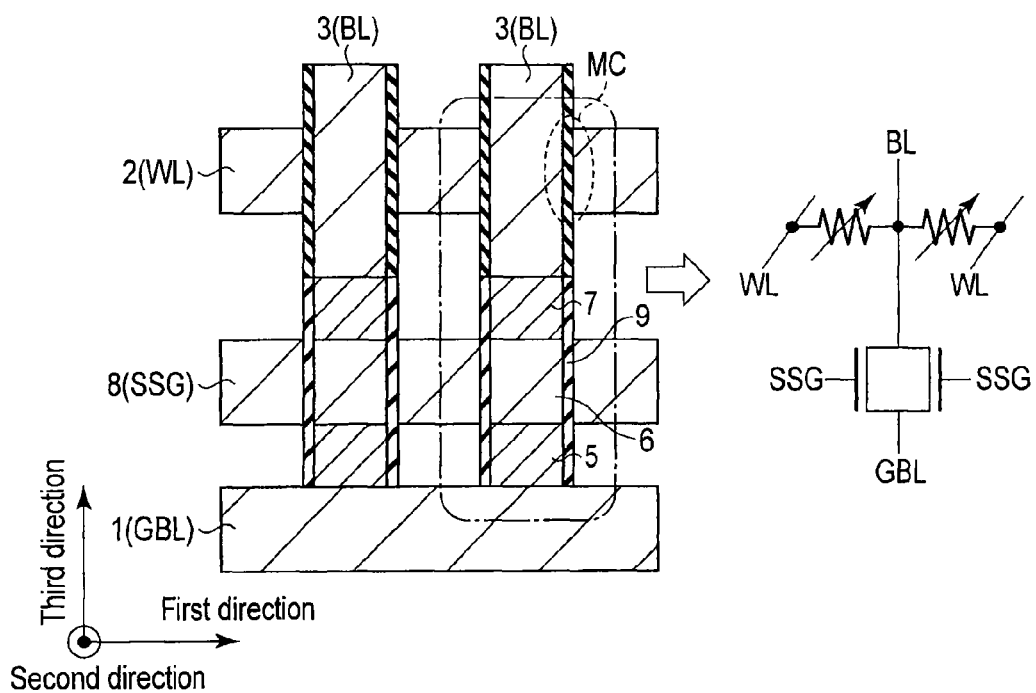
F I G. 2

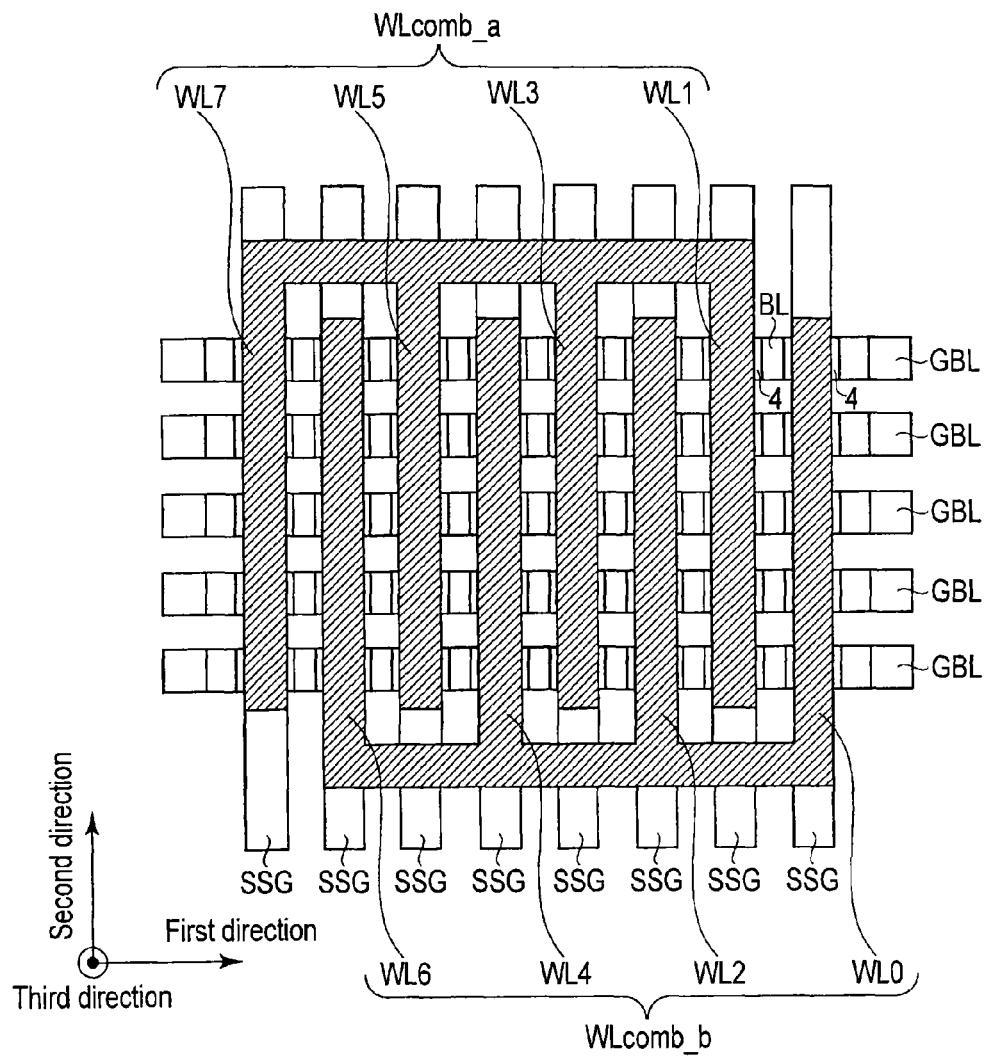
F I G. 3

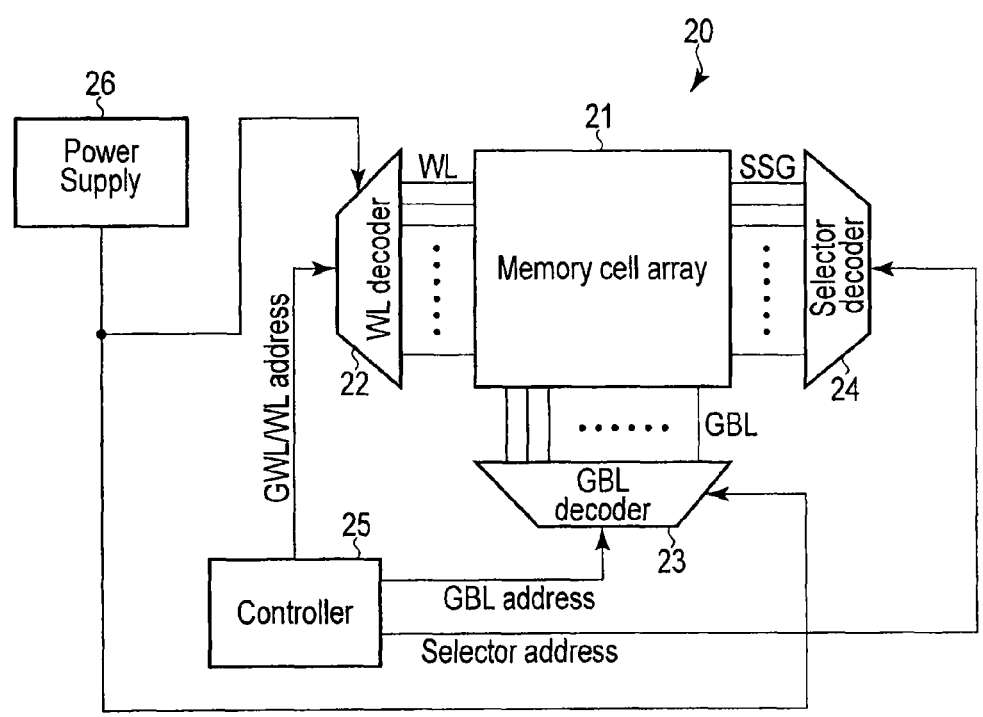
F I G. 4

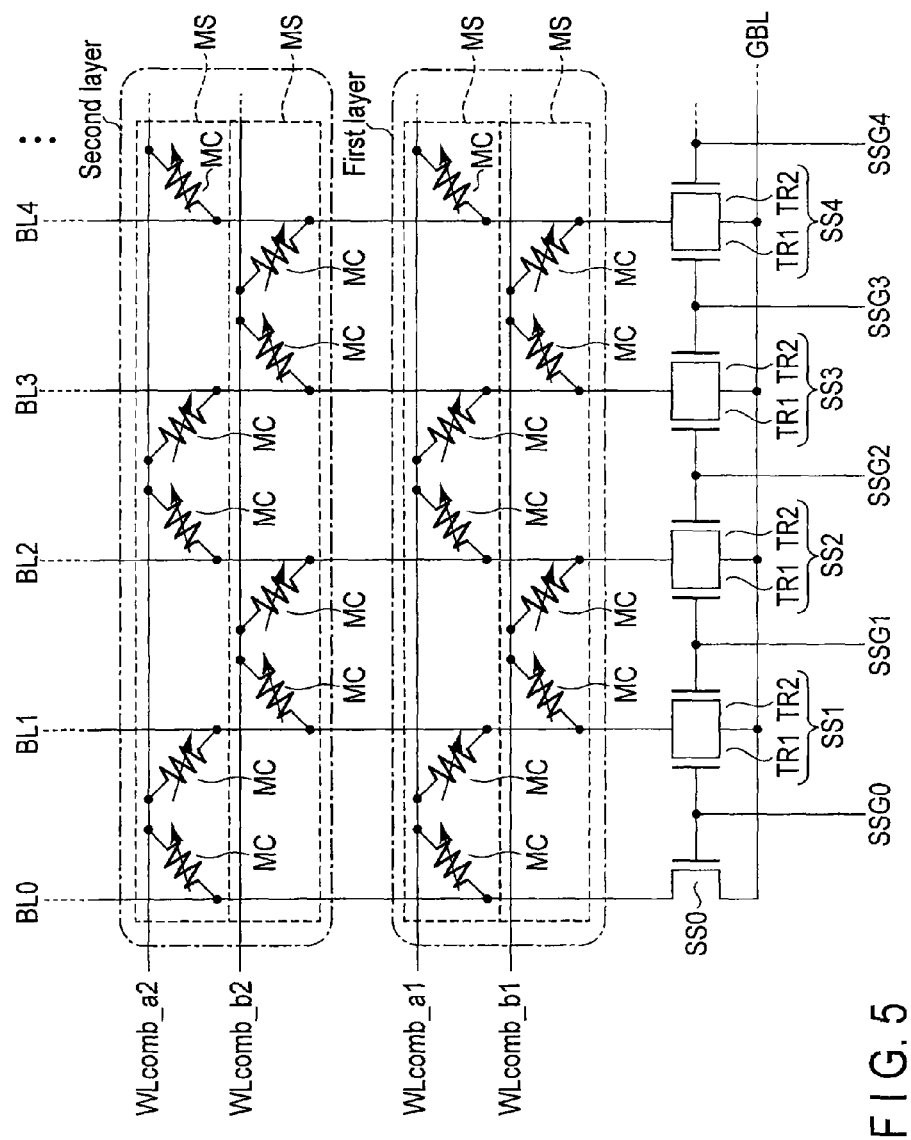
F I G. 5

| | Write | Erase | Read |
|---|---|---|---|
| SSG_s | Vg_w | Vg_e | Vg_r,0 |
| SSG_n | Vg_w | Vg_e | Vg_r,0 |
| SSG_u | 0 | 0 | 0 |
| GBL_s | Vw | Vof | Vr+Vo |
| GBL_u | Vwf | Vef+Vof | Vr+Vo |
| WL_s | 0 | Ves+Vof | Vo |
| WL_u | Vwf | Vef+Vof | Vr+Vo |

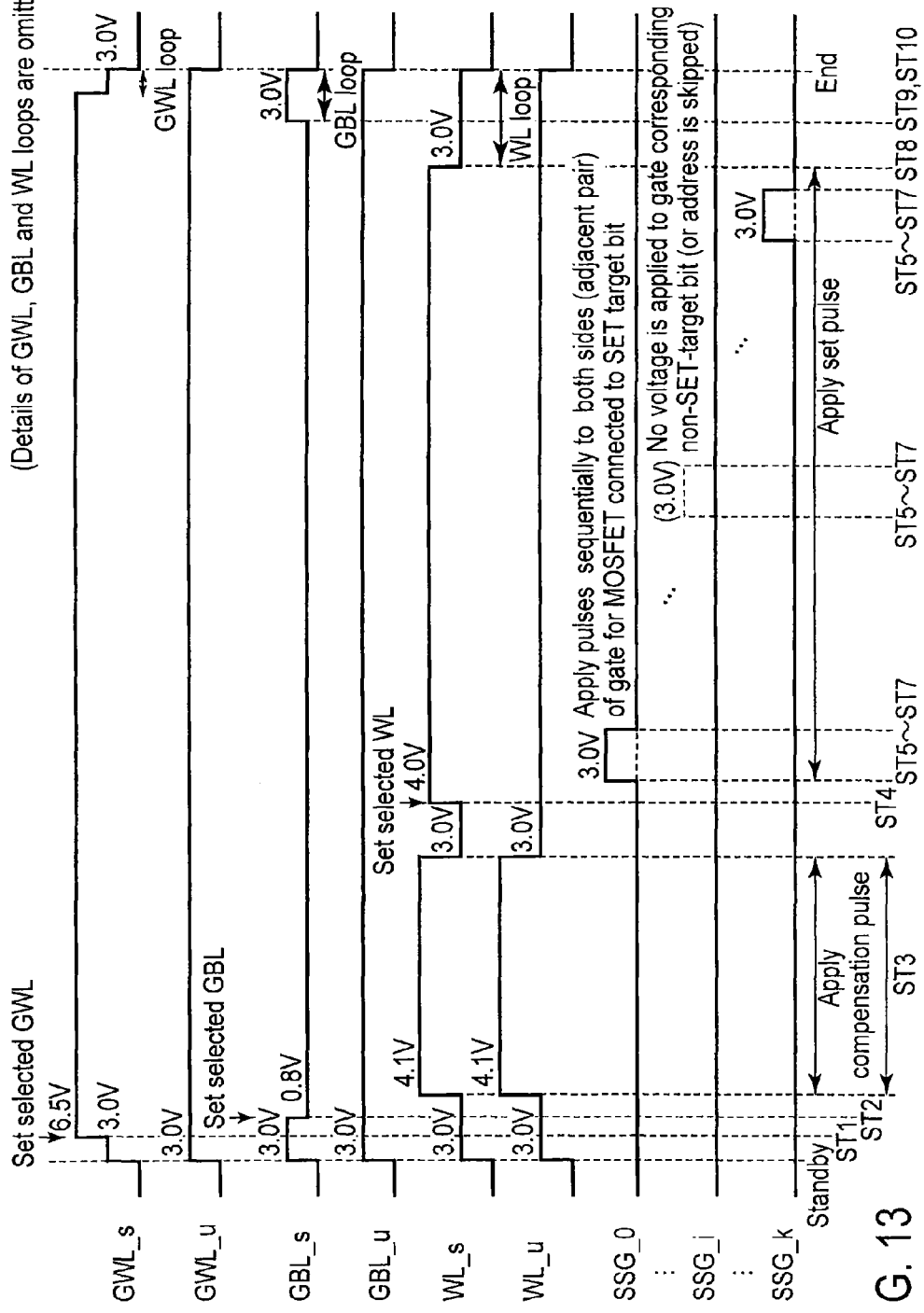
F I G. 13

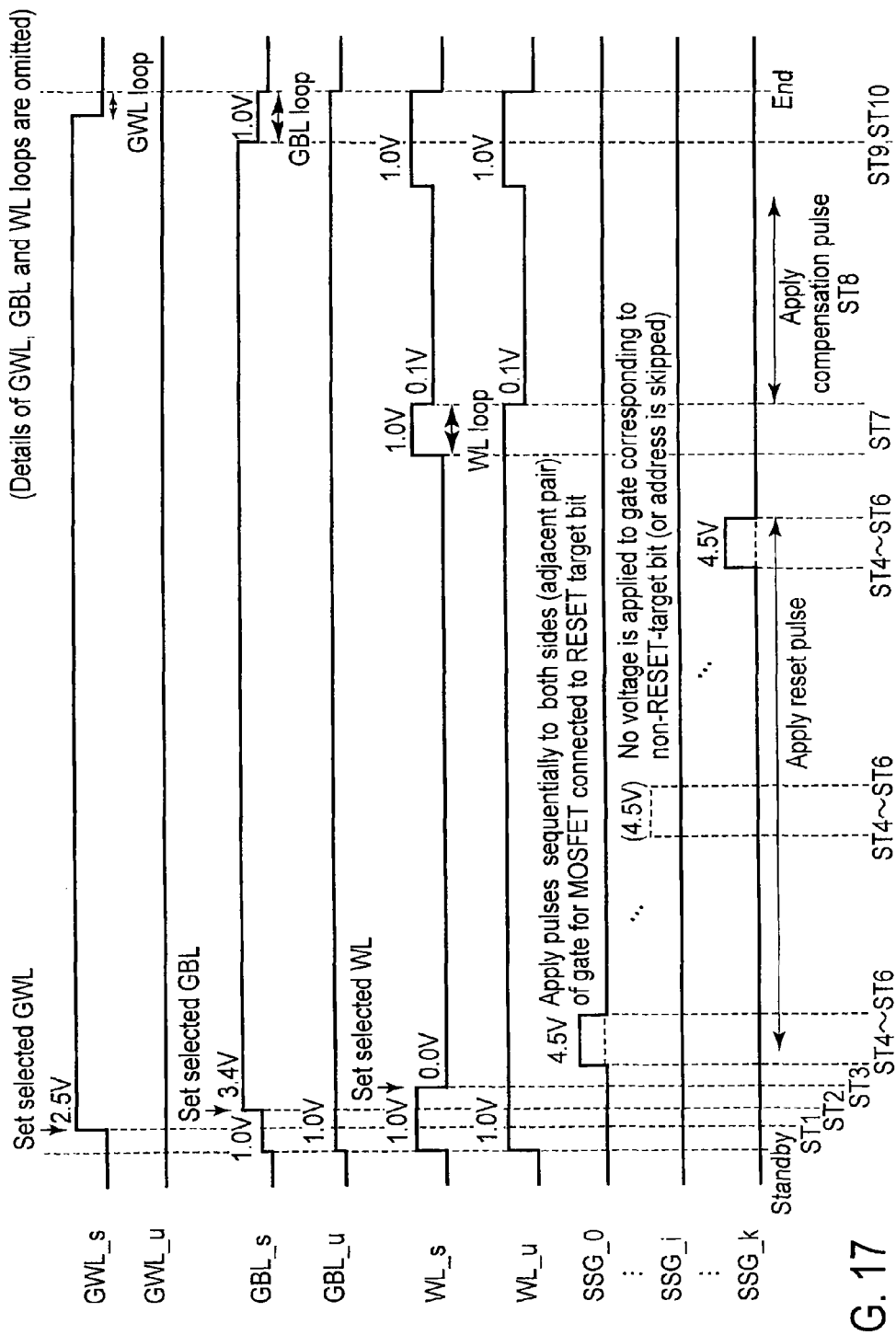
F I G. 17

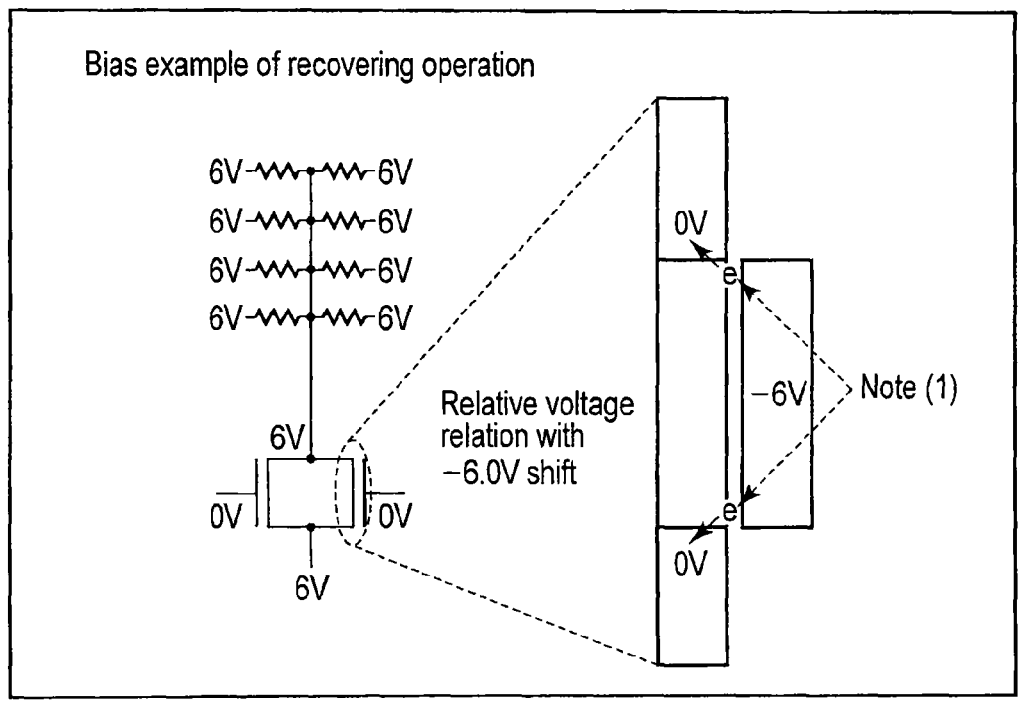
F I G. 23

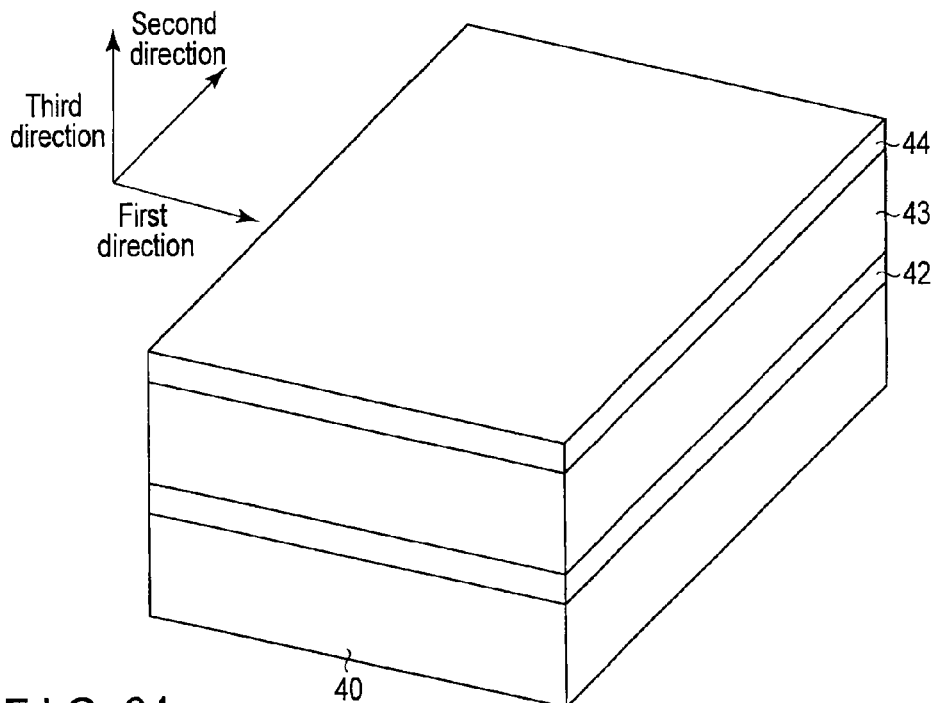
F I G. 24
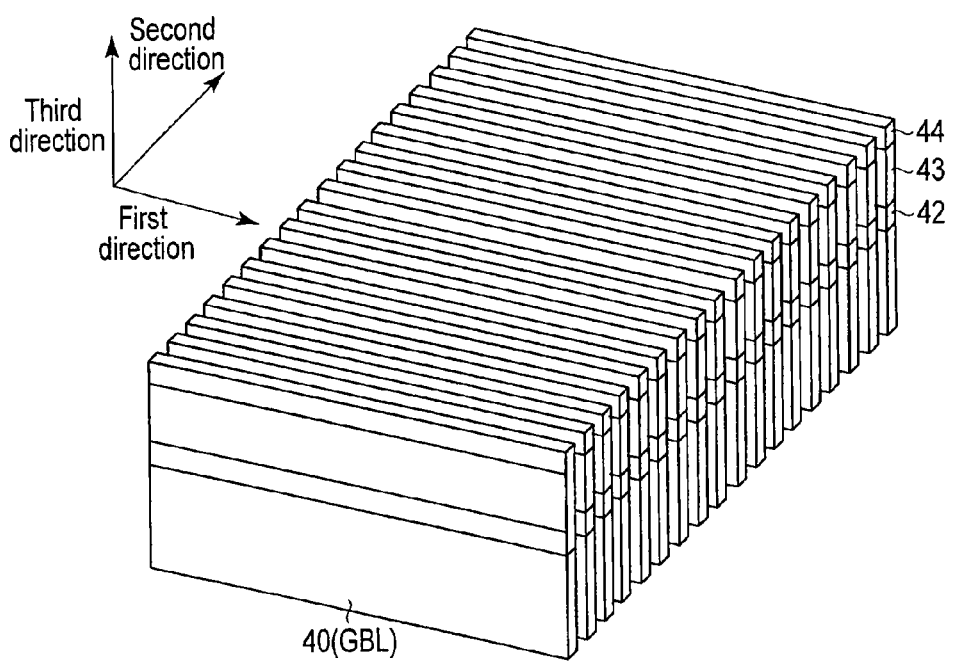
F I G. 25

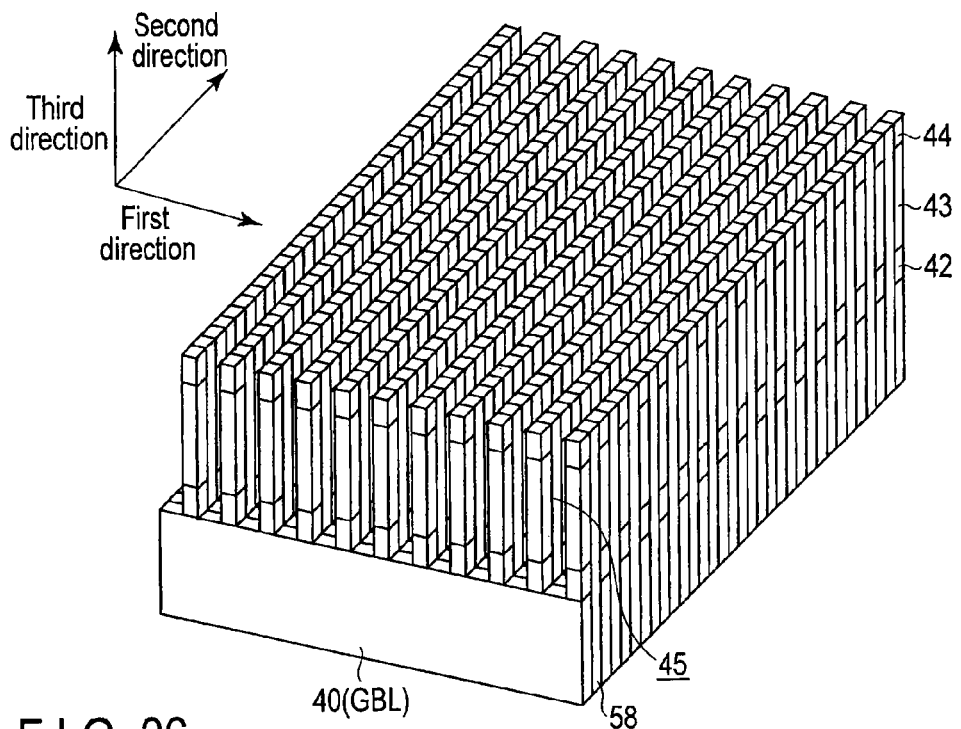
F I G. 26
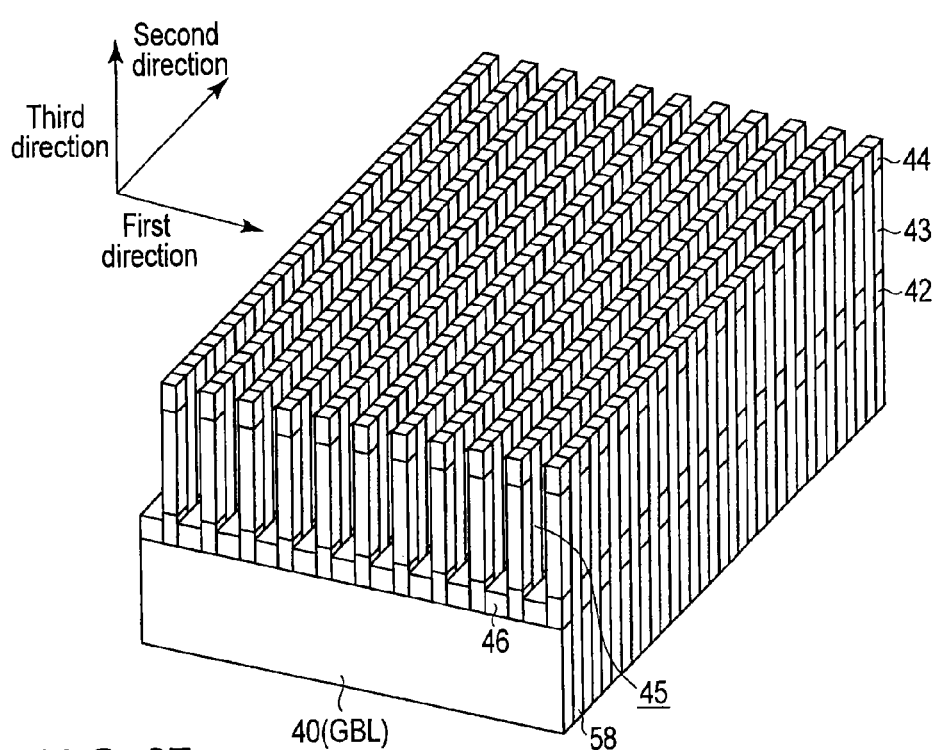
F I G. 27

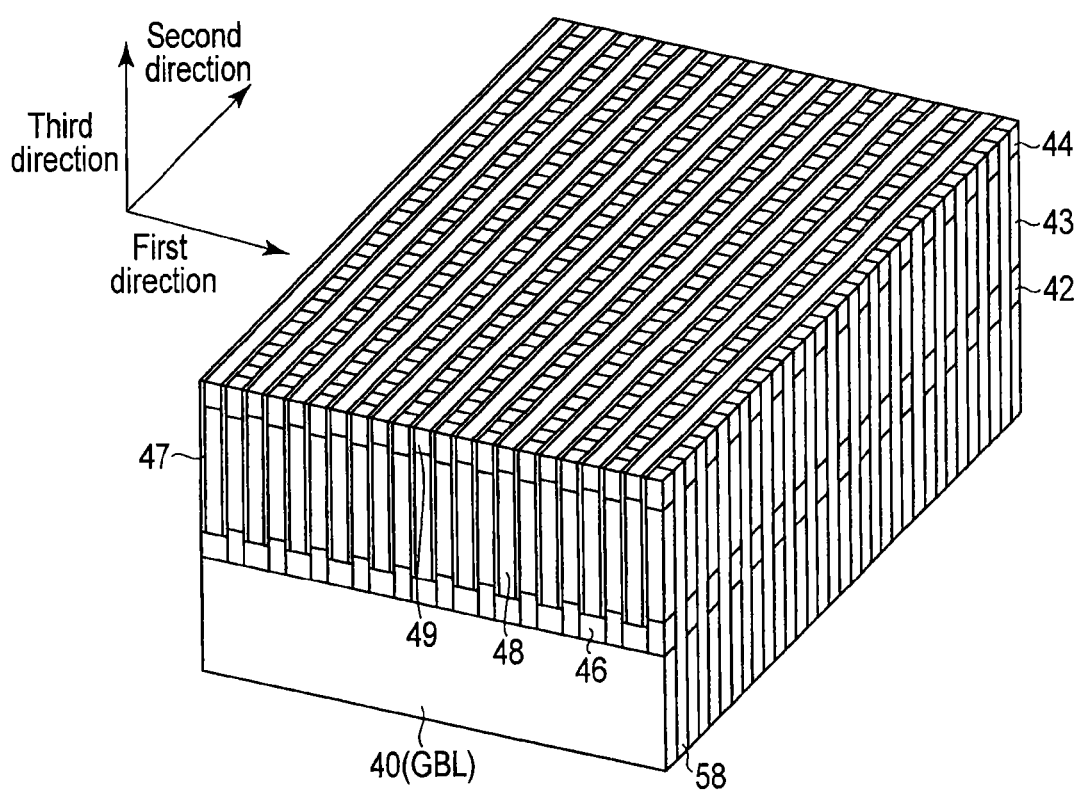
F I G. 30

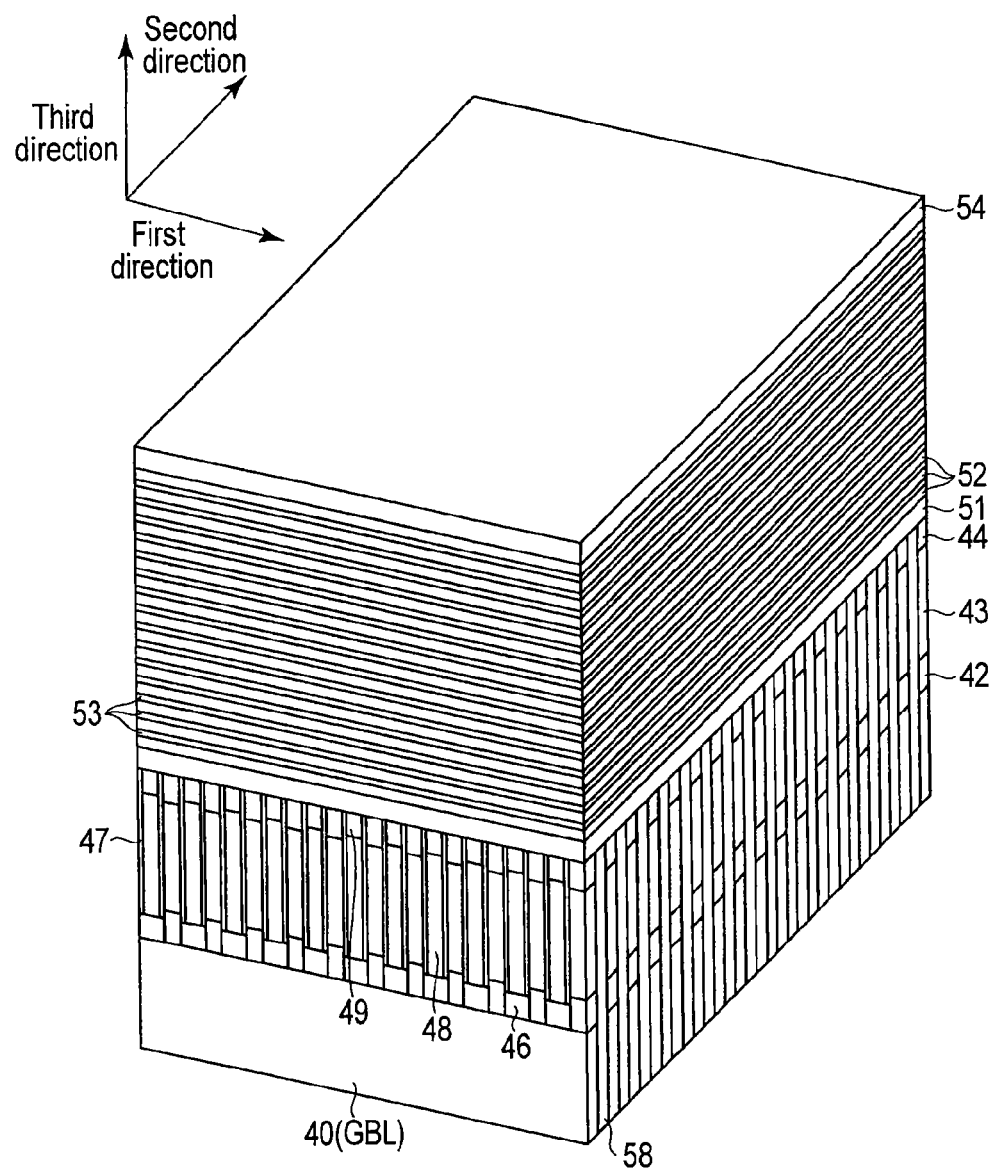
F I G. 31

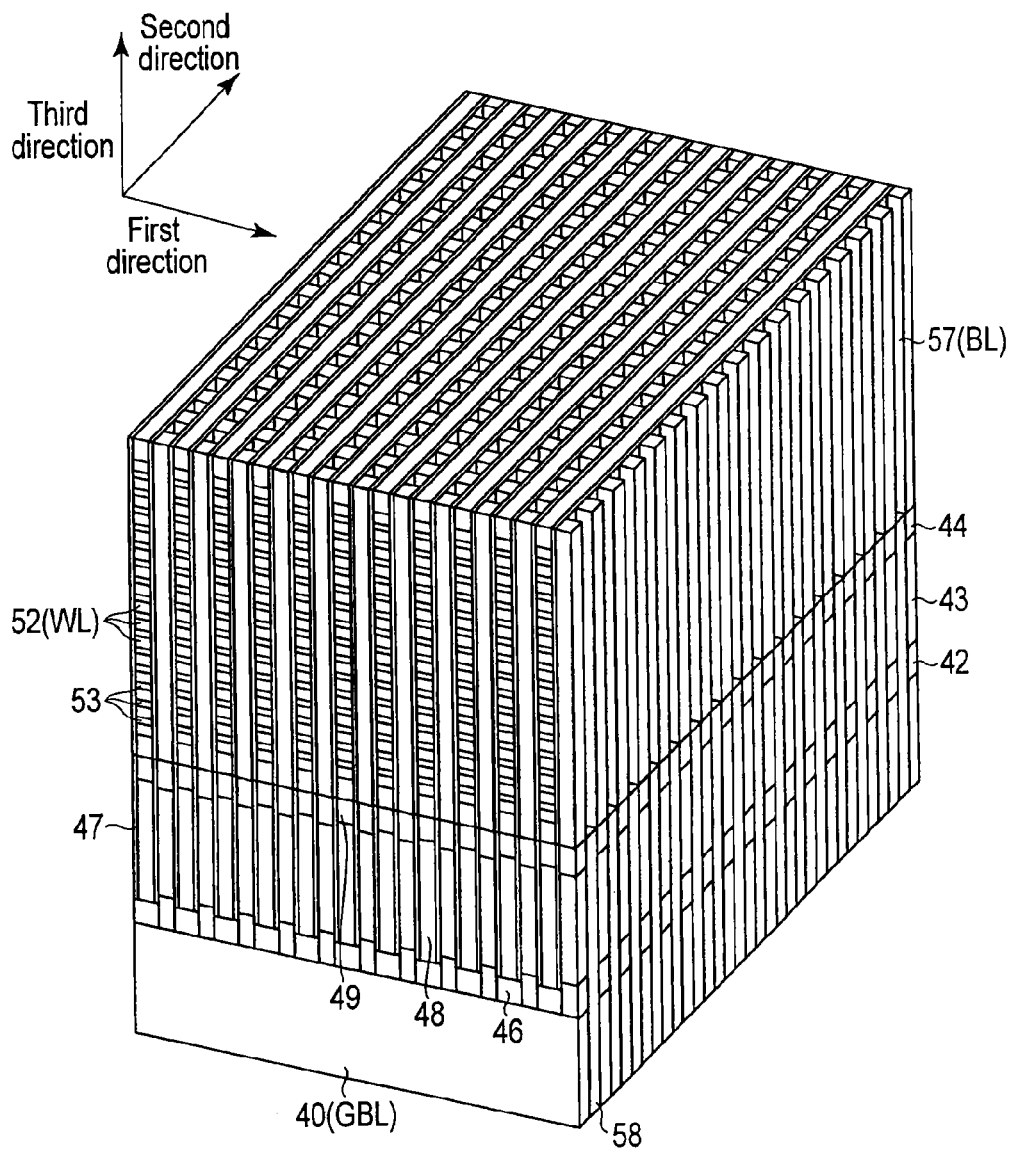
F I G. 35

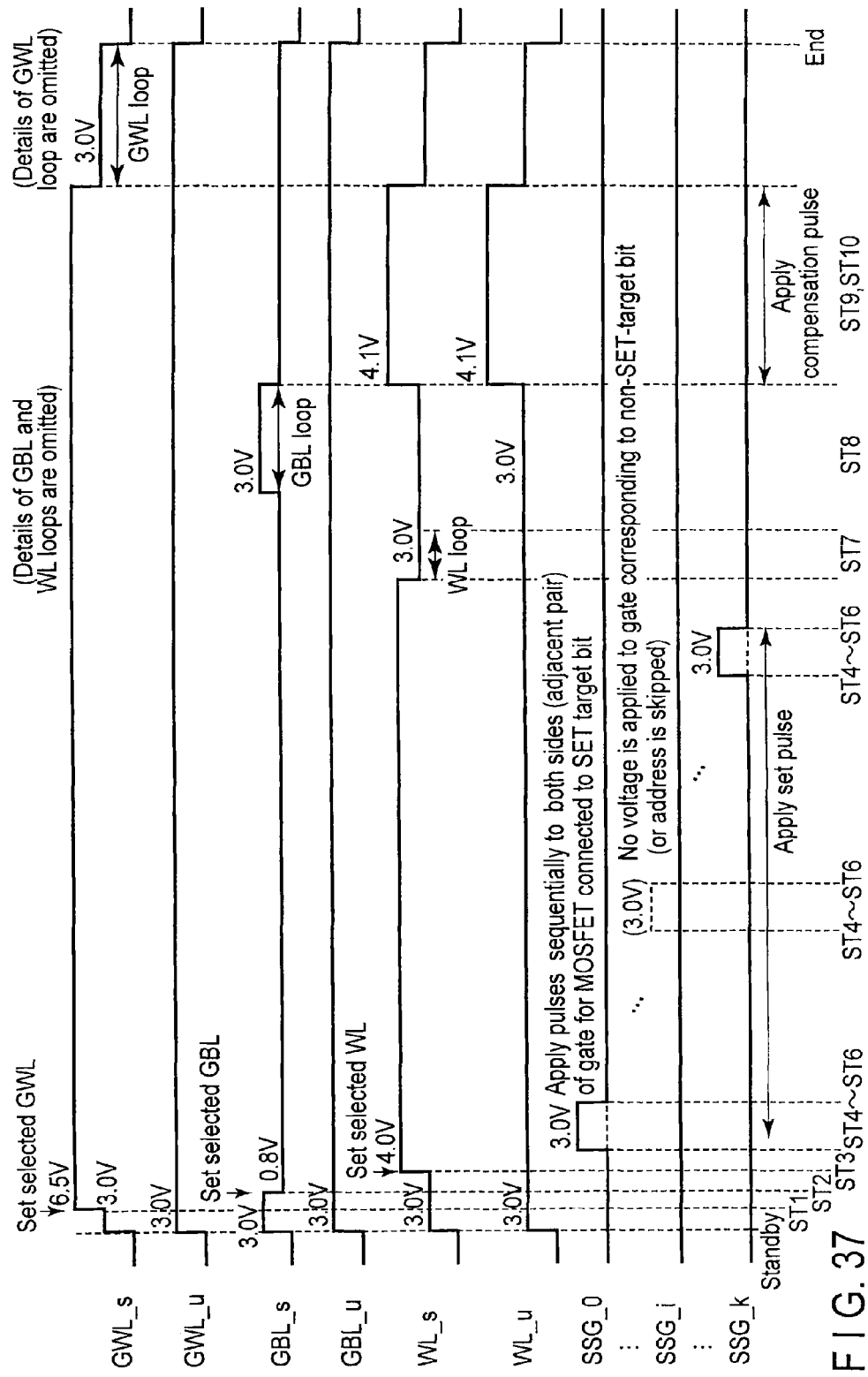
F I G. 37

MEMORY DEVICE AND METHOD OF CONTROLLING MEMORY DEVICE

CROSS-REFERENCE TO RELATED APPLICATIONS

This application claims the benefit of U.S. Provisional Application No. 61/823,026, filed May 14, 2013, the entire contents of which are incorporated herein by reference.

FIELD

Embodiments described herein relate generally to a memory device and a method of controlling a memory device.

BACKGROUND

Recently, there has been proposed a memory, called a resistive RAM (ReRAM), in which a memory cell is formed by a resistance change material. A memory cell of a ReRAM is expected to be highly integrated beyond a conventional trend.

BRIEF DESCRIPTION OF THE DRAWINGS

FIG. 1 is an example of a perspective view of a memory cell array;

FIG. 2 is a partial cross-sectional view of the memory cell array;

FIG. 3 is an example of a top view of the memory cell array;

FIG. 4 is an example of a block diagram of a storage device;

FIG. 5 is an example of a circuit diagram of the memory cell array;

FIG. 13 is an example of a waveform diagram of a set operation and a recovering operation;

FIG. 17 is an example of a waveform diagram of a reset operation and a recovering operation;

FIG. 23 is an example of a diagram illustrating a bias example of a recovering operation after a set/reset;

FIGS. 24 to 35 are examples of perspective views illustrating a manufacturing method;

FIG. 37 is an example of a waveform diagram of a set operation and a recovering operation.

DETAILED DESCRIPTION

Figures 6, 7:
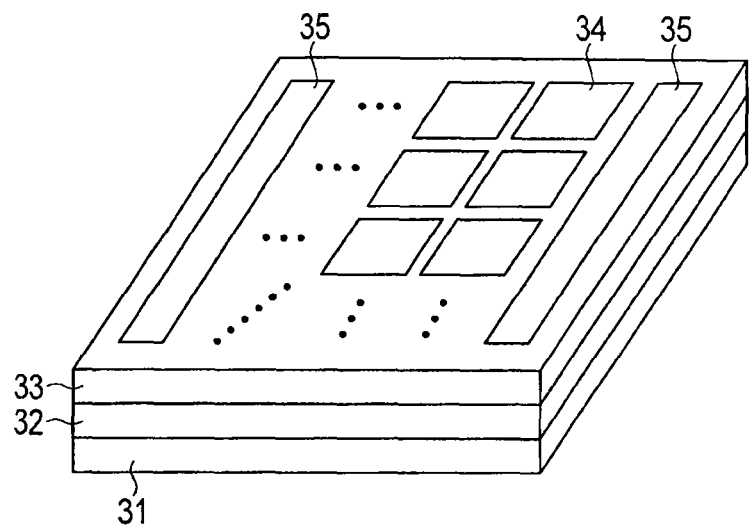
FIG. 6 is an example of an external view of the storage device.
FIG. 7 is an example of a diagram illustrating a bias relationship in an operation of the storage device.

In general, according to one embodiment, a memory device comprising: a first conductive line extending in a first direction; second conductive lines each extending in a second direction intersect with the first direction; a third conductive line extending in a third direction intersect with the first and second directions; resistance change elements connected between the second conductive lines and the third conductive line respectively; a semiconductor layer connected between the first conductive line and one end of the third conductive line; a select FET having a select gate electrode, and using the semiconductor layer as a channel; and a control circuit which is configured to execute a write/erase of at least one of the resistance change elements, and execute a recovering operation which adjusts a threshold voltage shift of the select FET by setting the first conductive line to a first potential, setting the select gate electrode to a second potential, setting all of the second conductive lines connected with the resistance change elements to a single third conductive line to a third potential, and setting at least one of the first potential or the third potential to higher than the second potential, after the write/erase.

Hereinafter, embodiments will be described with reference to drawings.

1. MEMORY CELL ARRAY

FIG. 1 illustrates an example of a memory cell array.

A plurality of global column lines 1, row lines 2, and column lines 3 is provided within a memory cell array. The global column lines 1 are formed in parallel to each other along a first direction, and, for example, are disposed in the lowermost layer of the memory cell array. The row lines 2 are formed in parallel to each other along a second direction perpendicular to the first direction, and are provided at positions higher than the global column lines 1 in a third direction perpendicular to the first and second directions. Layers of the row lines 2 (first layer, second layer, third layer, ... of FIG. 1) are provided plurally in the third direction (normal direction of a surface on which the global column lines 1 are disposed).

The column lines 3 extend along the third direction between the adjacent row lines 2, and are disposed plurally in the first and second directions. One end (lower end) of the column line 3 is electrically connected to any one of the global column lines 1. More specifically, in a two-dimensional plane formed in the first direction and the second direction, the column lines 3 disposed on the same column along the first direction are electrically connected to the same global column line 1.

A memory cell MC including a resistance change element is formed between each of the row lines 2 and each of the column lines 3. In the present example, a resistance change material 4 is formed on an entire surface of a side surface of the column line 3 (surface facing the row line 2). A part of the resistance change material 4 disposed between the column line 3 and the row line 2 functions as the memory cell MC.

Also, of the two sets facing side surfaces of the bit line 3, the resistance change material 4 in the present example is provided on two side surfaces facing in the first direction (two side surfaces facing the row line 2), and is not provided on two side surfaces facing in the second direction (two side surfaces not facing the row line 2).

A select element (sheet selector) SS is provided between the global column line 1 and the column line corresponding thereto. The select element SS is, for example, a field effect transistor (FET). Herein, the FET may also be referred to as a "select FET". In this case, the select element SS includes a source region 5 formed on the global column line 1, a semiconductor layer (channel region) 6 formed on the source region 5, and a drain region 7 formed on the semiconductor layer 6. The semiconductor layer 6 is, for example, a silicon layer.

Also, a select gate line (select gate electrode of the select FET) 8 is formed between adjacent semiconductor layers 6 in the second direction. The select gate line 8 is disposed in parallel to the row line 2. Moreover, a gate insulating layer 9 is formed between the select gate line 8 and the semiconductor layer 6.

Also, hereinafter, as in the general MOS memory device, the global column line 1, the row line 2, and the column line 3 may also be referred to as a global bit line GBL, a word line WL, and a bit line BL, respectively.

FIG. 2 illustrates an example of a partial cross-sectional view and an equivalent circuit of the memory cell array.

FIG. 2 is a partial cross-section of the inside of the plane formed in the first direction and the third direction of FIG. 1. As illustrated, the source region 5, the channel region 6, and the drain region 7 are sequentially stacked on one global bit line GBL to form the select element SS. The gate insulating layer 9 is formed on a side surface of the stacked structure.

The select gate line 8 (SSG) is provided between adjacent channel regions 6 in the second direction. A select FET (for example, MOS transistor), which is the select element SS, is formed by the source region 5, the channel region 6, the drain region 7, the gate insulating layer 9, and the select gate line 8 (SSG).

That is, the select element SS has two gates connected to different select gate lines SSG with respect to a set of the source region 5, the channel region 6, and the drain region 7. In other words, two select FETs are provided per a bit line BL. The select FETs share the source region 5, the channel region 6, and the drain region 7, and the gates are connected to different select gate lines SSG. Also, the select elements SS connected to different bit lines BL and adjacent in the first direction share the gate (select gate line SSG) with each other.

A pillar-shaped bit line BL is formed on the drain region 7 of each of the select elements SS. A resistance change material 4 functioning as a memory cell MC is formed on a side surface of the bit line BL. Moreover, a word line WL is formed in a region between the bit lines BL adjacent in the first direction. The resistance change material 4 is formed using, for example, HfO, so as to be in contact with the bit line BL and the word line WL.

The resistance change material 4, which is represented by HfO, is a material that transitions between at least two resistance values: a low resistance state (LRS) and a high resistance state (HRS). It is known that a resistance change material of a high resistance state transitions to a low resistance state when a voltage of a predetermined level or higher is applied thereto, and a resistance change material of a low resistance state transitions to a high resistance state when more than a predetermined amount of a current flows therethrough.

In particular, an element, in which a transition from a high resistance state to a low resistance state and a transition from a low resistance state to a high resistance state are performed by application of voltages with different polarities, is called a bipolar operation element. The resistance change material 4 performing such an operation can be provided with a thin film that is made of at least one of materials including $TiO_2$, $ZnMn_2O_4$, NiO, $SrZrO_3$, $Pr_{0.7}Ca_{0.3}MnO_3$, and carbon, in addition to HfO.

By the above manner, the memory cell MC including the resistance change material 4 provided between the word line WL and the bit line BL is disposed within the memory cell array, for example, in a three-dimensional matrix form. In the present structure, the word line WL and the bit line BL are just line-and-space patterns. The word line WL and the bit line BL have only to intersect with each other in a positional relationship, and it is unnecessary to consider a misalignment in a word line direction and a bit line direction.

Therefore, it is possible to loosen alignment accuracy in the memory cell during manufacture. This makes it possible to easily perform the manufacture. This structure is a highly integrated structure that can store 1-bit information in a $2F^2$ region.

FIG. 3 illustrates an example of a top view of the memory cell array.

FIG. 3 is a layout of the inside of the plane formed in the first direction and the second direction of FIG. 1, and in particular, a diagram for describing a plane pattern of the word line WL.

That is, FIG. 3 illustrates a pattern of a word line WL within any one of a plurality of layers of FIG. 1. In FIG. 3, a shaded region represents a layout of the word line WL.

As illustrated, the word line WL in one layer is commonly connected with every other line. In other words, the memory cell array includes two sets of word lines WL each having the comb-shaped structure, and regions of the word lines WL on a straight line along the second direction alternately belong to any one of the comb-shaped structures.

Furthermore, the present configuration can also be rephrased as follows.

When the word lines WL are labeled with WL0, WL1, WL2, . . . WL7 in order from the right side of the paper plane of FIG. 3, an electrically equal voltage is applied to odd word lines WL1, WL3, . . . WL7 (or these are commonly connected). On the other hand, an electrically equal voltage is also applied to even word lines WL0, WL2, . . . WL6 (or these are commonly connected). Different voltages may be applied between the odd word lines and the even word lines (or the odd word lines and the even word lines are separated from each other).

Hereinafter, the set of the odd word lines will be referred to as a word line comb WLcomb_a, and the set of the even word lines will be referred to as a word line comb WLcomb_b. Also, in the case of not distinguishing between both sides, the two combs will be simply referred to as word line comb WLcomb.

Also, although FIG. 3 illustrates the case of including eight word lines, five global bit lines GBL, and forty-five bit lines BL, this is merely exemplary, and the number of these conductive lines can be appropriately changed.

2. OVERALL CONFIGURATION OF STORAGE DEVICE

FIG. 4 is an example of a block diagram illustrating an overall configuration of a storage device.

The storage device 20 includes a memory cell array 21, a WL decoder 22, a GBL decoder 23, a selector decoder 24, a controller 25, and a power supply 26.

The memory cell array 21 has the configuration described with reference to FIGS. 1 and 2. FIG. 5 is an equivalent circuit of the memory cell array 21. As illustrated in FIG. 5, a memory cell MC including a resistance change element (resistance change material 4 of FIGS. 1 and 2) is disposed in the memory cell array 21 in a matrix form. In the memory cell MC, one end of the resistance change element is connected to any one of the bit lines BL (BL0, BL1, . . . ), and the other end of the resistance change element is connected to any one of the word line combs WLcomb (WLcomb_a, WLcomb_b).

Also, in FIG. 5, the word line combs WLcomb_a and WLcomb_b are denoted by WLcomb_ai and WLcomb_bi respectively, but i represents number of a layer where a corresponding word line comb is formed (represents what layer is in order, if the first layer, i=1, if the second layer, i=2, the same hereinafter).

Each of the bit lines BL is connected to the corresponding global bit line GBL through the corresponding select element SS (SS0, SS1, SS2, . . . ). Furthermore, gates of the adjacent select elements SS are connected to a common select gate line SSGj (j is a natural number). The select element SS may be considered as a set of two select FETs TR1 and TR2 connected in parallel and commonly having a source and a drain.

A gate of one of the two select FETs constituting a certain select element SS (for example, TR1) is shared with a gate of one of the two select FETs constituting the adjacent select element SS (for example, TR2).

Also, a gate of the one of the two select FETs constituting the certain select element SS (for example, TR2) is shared with a gate of the other of the two select FETs constituting the adjacent select element SS (for example, TR1).

However, the select element SS disposed at the endmost portion is configured by only one of the transistor TR1 and the transistor TR2.

The three-dimensional stacked memory cell array of FIG. 1 has a plurality of configurations of FIG. 5.

That is, FIG. 5 corresponds to the illustration of the example of the memory cell array MS included in the two-dimensional plane formed in the first direction and the third direction in FIG. 1. The memory cell array MS is disposed plurally along the second direction. In this case, the word line combs WLcomb_ai, the word line combs WLcomb_bi, and the select gate lines SSGj are commonly connected each other between the memory cell arrays MS. On the contrary, the bit lines BL and the global bit lines GBL are separated between the memory cell arrays MS.

Returning to FIG. 4, the description will be continued. The WL decoder 22 includes a word line selection unit and a word line driver. The word line selection unit selects a word line WL, based on a WL address received from the controller 25. The word line driver can apply voltages necessary for reading, writing and erasing data to a selected word line and an unselected word line.

The GBL decoder 23 includes a global bit line selection unit and a global bit line driver. The global bit line selection unit selects a global bit line GBL, based on a column address received from the controller 25. The global bit line driver can apply voltages necessary for reading, writing, and erasing data to a selected global bit line and an unselected global bit line.

The selector decoder 24 includes a selector selection unit and a select gate line driver. The selector selection unit selects a select gate line SSG, based on a sheet address received from the controller 25. The select gate line driver can apply voltages necessary for reading, writing, and erasing data to a selected select gate line and an unselected select gate line.

Also, the "sheet" represents a set of memory cells selected by any one of the select gate lines 8. That is, in FIG. 1, the sheet is a set of memory cells existing in the plane formed in the second direction and the third direction.

The controller 25 controls an overall operation of the storage device 20. Also, the controller 25 can transmit a row address to the WL decoder 22, transmit a column address (GBL address) to the GBL decoder 23, and transmit a selector address to the selector decoder 24.

Also, at the time of writing data, the controller 25 can instruct the WL decoder 22, the GBL decoder 23, and the selector decoder 24 to apply necessary voltages so as to change a resistance state of a resistance change element of a selected memory cell MC.

At the time of reading data, the controller 25 can instruct the WL decoder 22, the GBL decoder 23, and the selector decoder 24 to apply necessary voltages so as to detect a resistance value of a resistance change element of a selected memory cell MC as a storage state of the corresponding memory cell MC.

Moreover, the controller 25 includes a sense amplifier and can sense (amplify) data read in the global bit line GBL by the sense amplifier.

The power supply 26 generates predetermined voltages necessary for reading, writing, and erasing data. The voltages generated by the power supply 26 are applied to the word line WL and the bit line BL.

For example, when writing data, a large potential difference is generated between a selected word line and a selected bit line, and a resistance state of a resistance change element is transitioned. Also, when reading data, a potential difference can be generated between a selected word line and a selected bit line in a range where a transition of a resistance state does not occur, and a current flowing through the bit line or the word line can be detected.

FIG. 6 illustrates an example of an outer appearance of the storage device.

A CMOS circuit 32 including an interconnection layer is formed on a semiconductor substrate (for example, silicon substrate) 31 by a commonly used process. A layer 33 including a plurality of memory cell units 34 is formed on the CMOS circuit 32. Each of the memory cell units 34 of FIG. 6 corresponds to the memory cell array of FIG. 1, and wires are formed based on, for example, a 20-nm design rule. Also, a portion called a peripheral circuit in a general memory is included in the CMOS circuit 32 of FIG. 6. This portion contains the decoders 22 to 24 and the controller 25 of FIG. 4.

Also, with the exception of the connection portion to the memory cell unit 34, the CMOS circuit 32 can be designed and manufactured based on, for example, a 100-nm design rule, which is looser than the memory cell unit 34. The layer 33 includes an electrical connection portion for the CMOS circuit 32 around each of the memory cell units 34. Blocks based on units of the memory cell unit 34 and the connection portion are disposed in a matrix form.

Furthermore, a through-hole is formed in the layer 33. An input/output unit 35 of the present device, including a terminal electrically connected to an input/output unit of the CMOS circuit 32 through the through-hole, can be formed in, for example, an end portion of the layer 33.

On the other hand, since the memory cell unit 34 and the CMOS circuit 32 are connected in a vertical direction to a substrate surface, an operating time can be reduced or the number of cells capable of being read and written at the same time can be significantly increased, without any increase in a chip area.

Also, an interconnection drawing pad is formed in the input/output unit 35 of the device and can be bonded to a lead frame in a package process.

3. OPERATION

The operation of the above-mentioned storage device will be described.

Figure 8:
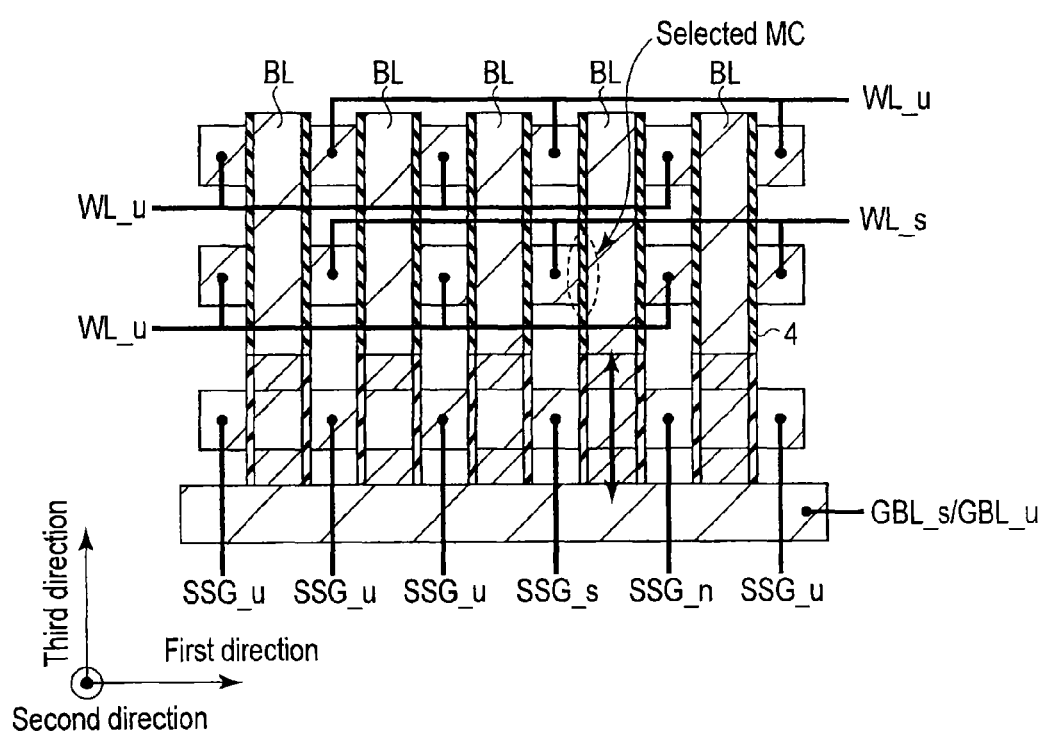
FIG. 8 is an example of a cross-sectional view of the memory cell array.

FIG. 7 illustrates an example of a bias relationship in the operation of the storage device. FIG. 8 is an example of a cross-sectional view of the memory cell array and illustrates the plane formed in the first direction and the third direction in FIG. 1.

In the following description, among global bit lines GBL, a selected global bit line is labeled with GBL_s, and an unselected global bit line is labeled with GBL_u. Also, among word lines WL, a selected word line is labeled with WL_s, and an unselected word line is labeled with WL_u. Furthermore, among select gate lines SSG, two select elements SS corresponding to a bit line BL, to which a selected memory cell MC is connected, are selected and labeled with SSG_s and SSG_n. The other select gate lines SSG are considered as unselected, and are labeled with SSG_u.

Figure 36:
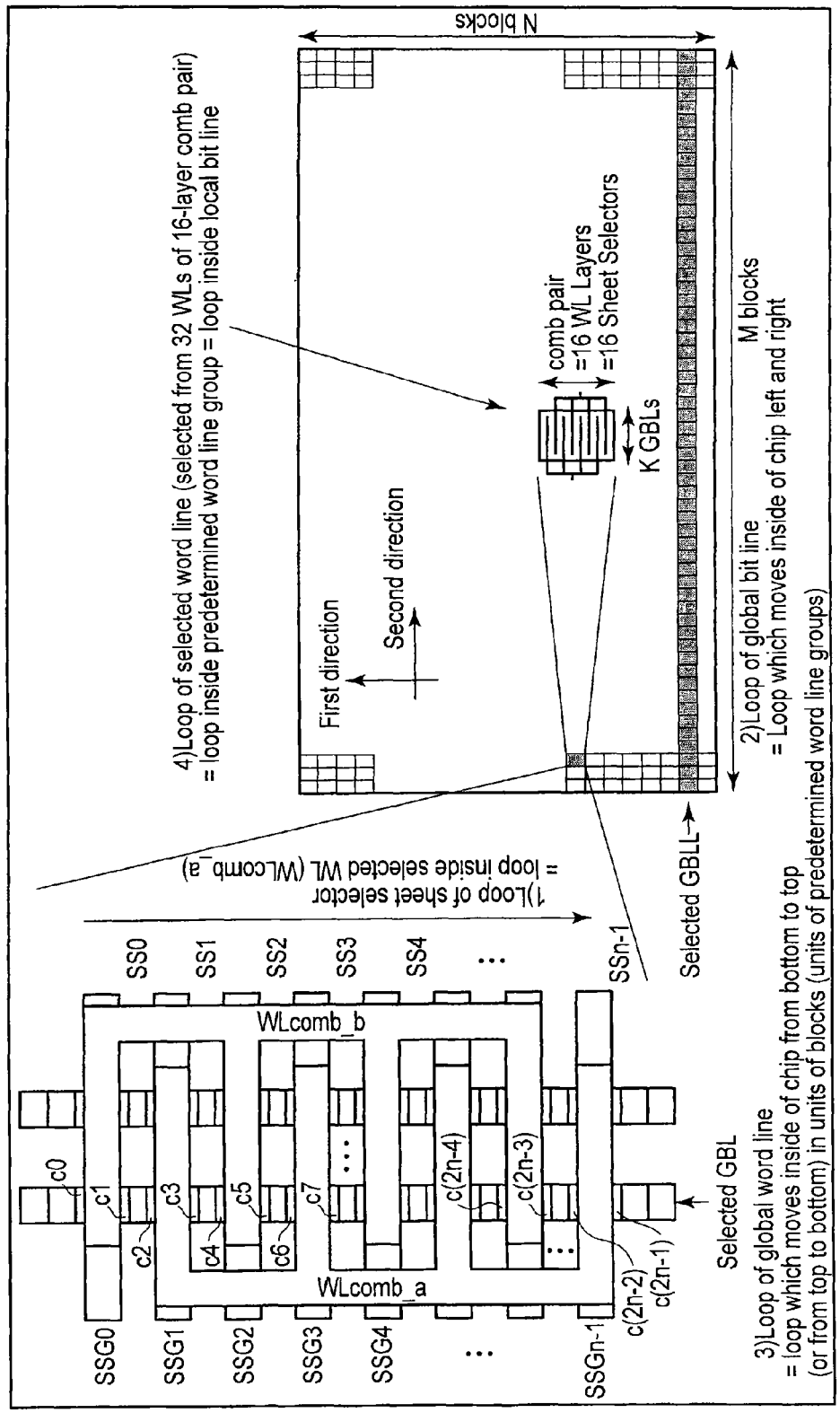
FIG. 36 is an example of a diagram illustrating an example of a layer of processing loop.

FIG. 36 illustrates an example of a block configuration of a memory cell array. As illustrated in the right diagram of FIG. 36, the memory cell array includes a plurality of blocks. In the example of FIG. 36, N blocks are disposed in the first direction, and M blocks are disposed in the second direction. Also, global bit lines GBL are disposed in the second direction. Herein, one block is configured as illustrated in the middle diagram of FIG. 36. Herein, the selection of the block may be performed by two-dimensional decoding. That is, control lines of word line WL drivers of the blocks arranged in the second direction may be commonly selected by the global word line GWL, and source lines of the word line WL drivers of the blocks arranged in the first direction may be selected by the common source line.

For example, one block includes k global bit lines GBL, and includes word line layers of p layers. Also, one block includes two word line combs WLcomb. Herein, n/2 word lines are connected to one block, one word line layer, and one global bit line GBL. That is, n memory cells MC are connected to one block, one word line layer, and one global bit line GBL to form n sheet selectors (select elements) SS configured to select the memory cells MC. Herein, selecting loop of the sheet selectors configured to sequentially select the select elements SS belonging to one word line comb are defined as a sheet selector loop. For example, the sheet selectors belonging to WLcomb_a are the select elements SS0 to SSn−1. Likewise, the sheet selectors belonging to WLcomb_b are the select elements SSn−1 and SS0 to SSn−2. That is, when the word line WLcomb_a is selected and the select elements SS are selected in order of SS0 to SSn−1, the memory cells c2, c3, c6, c7, . . . c2n−2, and c2n−1 are selected. Also, when the word line WLcomb_b is selected and the select elements SS are selected in order of SSn−1 and SS0 to SSn−2, the memory cells c0, c1, c4, c5, c2n−4, and c2n−3 are selected.

3.1 Reset Operation

Next, a write operation of storing information in a memory cell will be described.

In a write operation, the GBL decoder 23 applies a write voltage Vw (>0 V) to the selected global bit line GBL_s, and applies Vwf, for example, a half of the write voltage (Vw/2), to the unselected global bit line GBL_u.

Also, the WL decoder 22 applies 0 V to the selected word line WL_s, and applies Vwf, for example, (Vw/2), to the unselected word line WL_u.

Furthermore, the selector decoder 24 applies a write gate voltage Vg_w (>0 V) to both of the two select gate lines SSG_s and SSG_n, and applies 0 V to the other select gate lines SSG_u.

As a result, in the select element SS connected to the selected bit line BL, a channel is formed by the two select gate lines SSG_s and SSG_n, and the write voltage Vw is transferred from GBL_s to the selected memory cell MC. On the other hand, 0 V is transferred from WL_s to the selected memory cell MC.

Therefore, data is written to the memory cell MC by applying a potential difference of Vw to both terminals of the resistance change element of the memory cell MC, and the resistance state of the memory cell MC becomes a high resistance state. As a result, the data is written to the memory cell.

3.2 Set Operation

Next, an operation of erasing information retained in the memory cell will be subsequently described with reference to FIGS. 7 and 8.

In an erase operation, considering that the element performs a bipolar operation, the WL decoder 22 applies Ves+Vof, for example, a voltage (Ve+1) obtained by adding an offset voltage Vof (=1 V) to an erase voltage Ve (=Ves), to the selected word line WL_s, and applies Vef+Vof, for example, a voltage ((Ve/2)+1) obtained by adding the offset voltage Vof to a half of the erase voltage Ve (=Vef), to the unselected word line WL_u.

Also, the GBL decoder 23 applies an offset voltage of 1 V to the selected global bit line GBL_s, and applies Vef+Vof, for example, ((Ve/2)+1), to the unselected global bit line GBL_u.

Furthermore, the selector decoder 24 applies an erase gate voltage Vg_e to both of the select gate lines SSG_s and SSG_n, and applies 0 V to the other select gate lines SSG_u.

As a result, as described at the time of the writing, the voltage Ve is transferred to the selected memory cell MC. Data is erased by applying a potential difference of Ve to both terminals of the resistance change element, and the resistance state of the memory cell MC becomes a low resistance state. As a result, the data of the memory cell MC is erased.

Herein, the reason why the offset voltage Vof of about 1 V is input to the global bit line and the word line is as follows: due to characteristics of the select element to be described below, it is possible to significantly reduce a leakage current to the unselected memory cell by setting the potential of the selected global bit line GBL_s to be about 1 V higher than the unselected select gate line SSG_u, and technique for raising the entire voltages of the global bit line and the word line is effective to provide a predetermined potential difference by avoiding a negative voltage circuit, whose required circuit area is relatively large.

3.3 Read Operation

Next, an operation of reading information from the memory cell will be subsequently described with reference to FIGS. 7 and 8.

In a read operation, the GBL decoder 23 applies a voltage (Vr+Vo), which is obtained by adding an offset voltage Vo to a read voltage Vr, to the selected global bit line GBL_s and the unselected global bit line GBL_u.

Also, the WL decoder 22 applies the offset voltage Vo to the selected word line WL_s, and applies (Vr+Vo) to the unselected word line WL_u.

Furthermore, the selector decoder 24 applies a read gate voltage Vg_r to one of the select gate lines SSG_s and SSG_n, applies 0 V to the other, and applies 0 V to the remaining select gate lines SSG_u.

As a result, as described at the time of the writing, the voltage Vr is transferred to the selected memory cell MC through the selected bit line BL. Herein, a current flowing through the selected memory cell MC is different by the resistance state (HRS or LRS) of the selected memory cell MC. For example, data stored in the selected memory cell MC is determined by detecting the current value in the sense amplifier connected to the selected global bit line GBL_s.

Also, generally, for the selected word lines WL_s, only one word line is selected per a memory cell array; however, for the selected global bit lines GBL_s, a plurality of global bit lines may be selected at the same time. Therefore, simultaneously, a bandwidth can be improved due to an increase in the number of bits on which writing, erasing, and reading can be performed.

4. TEMPORAL CHANGE OF SELECT ELEMENT

A temporal change of the select element SS will be described.

The select element SS has an FET structure and uses a region, whose channel width is very narrow in F, as a channel. Therefore, in order to ensure a current necessary for cell driving, it is required to use a bias condition of a relatively high source-drain voltage, and a so-called hot carrier generation probability is relatively high.

Simultaneously, like a so-called SOI element, the select element SS is configured so that hot carriers cannot escape to a substrate. Also, there can be many cases where a gate oxide film is a film having a high defect density as compared with a general planar MOSFET. Therefore, hot carriers are easily trapped in the gate oxide film, and it is likely that a long-term characteristic variation such as a reduction of an ON current and/or an increase of an OFF current will become remarkable.

Therefore, the following description will be given of technique for aiming at avoiding the occurrence of reliability deterioration due to the long-term characteristic variation and solving the phenomenon by providing recovering processing of the select element SS. Specifically, by utilizing the fact that a polarity of a carrier easily to take in a condition of a high gate voltage and a polarity of a carrier easily to take in a condition of a low gate voltage are reversed, a carrier trapped in the gate oxide film is neutralized or detrapped.

For example, a common characteristic of the storage devices of the following embodiments is to include: a first conductive line extending in a first direction; second conductive lines extending in a second direction intersecting with the first direction; a plurality of third conductive lines extending in a third direction intersecting with the first and second directions; a plurality of resistance change elements each connected between the second conductive line and the third conductive lines; a semiconductor layer connected between one end of the third conductive layer and the first conductive layer; a select FET using the semiconductor layer as a channel and having a select gate electrode; and a control circuit configured to execute a write/erase of at least one of the resistance change elements, and execute a recovering operation which adjusts a threshold value shift of the select FET by setting the first conductive line to a first potential, setting the select gate electrode to a second potential, setting all of the second conductive lines connected through the resistance change elements to a single third conductive line to a third potential, and setting at least one of the first potential and the third potential to higher than the second potential, after the write/erase.

Also, for example, the first and third potentials are different from each other, and the recovering operation is executed by flowing a current (for example, a punch-through current) flow to the select FET. Herein, a direction of the current is the same as a direction of a current which flows to the select FET in the write/erase.

Also, for example, the first and third potentials are equal to each other, and the recovering operation may be executed by applying an electric field to the gate insulating layer of the select FET.

Furthermore, it is desirable that the first potential is equal to a potential of the first conductive line in the write/erase, the second potential is smaller than a potential of the select gate electrode in the write/erase, and the third potential is different from a potential of a selected conductive line among the second conductive lines and a potential of each of unselected conductive lines among the second conductive lines in the write/erase.

Also, the second potential is, for example, a ground potential.

Also, a potential difference between the first and third potentials, for example, is larger than a potential difference between a potential of the first conductive line and a potential of each of unselected conductive lines among the second conductive lines in the write/erase. It is desirable that the control circuit is configured to change a condition of the recovering operation based on an output value of a current detection circuit connected to the first conductive line.

4.1 First Embodiment

Figure 9:
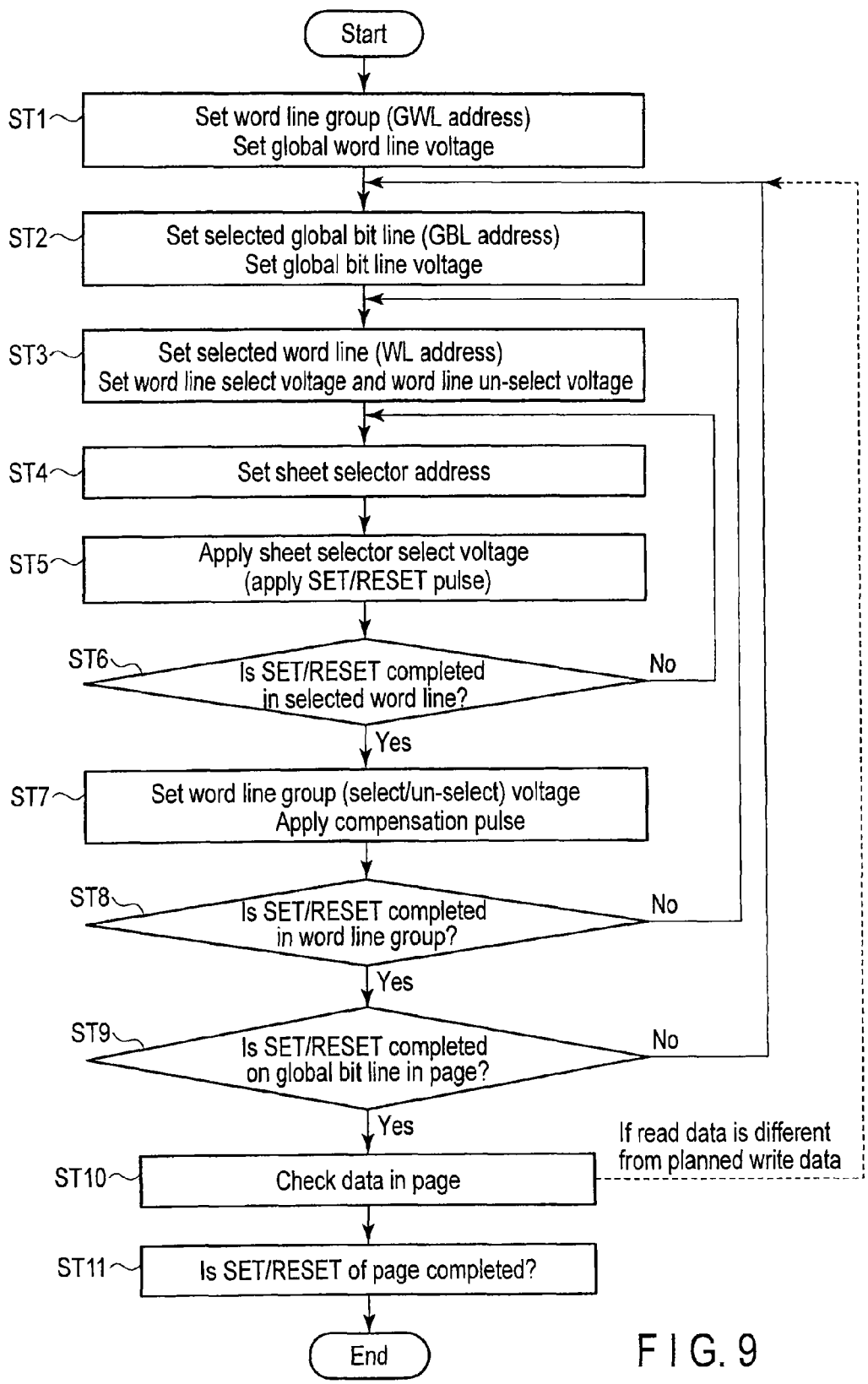
FIG. 9 is an example of a flowchart according to a first embodiment.
Figure 10:
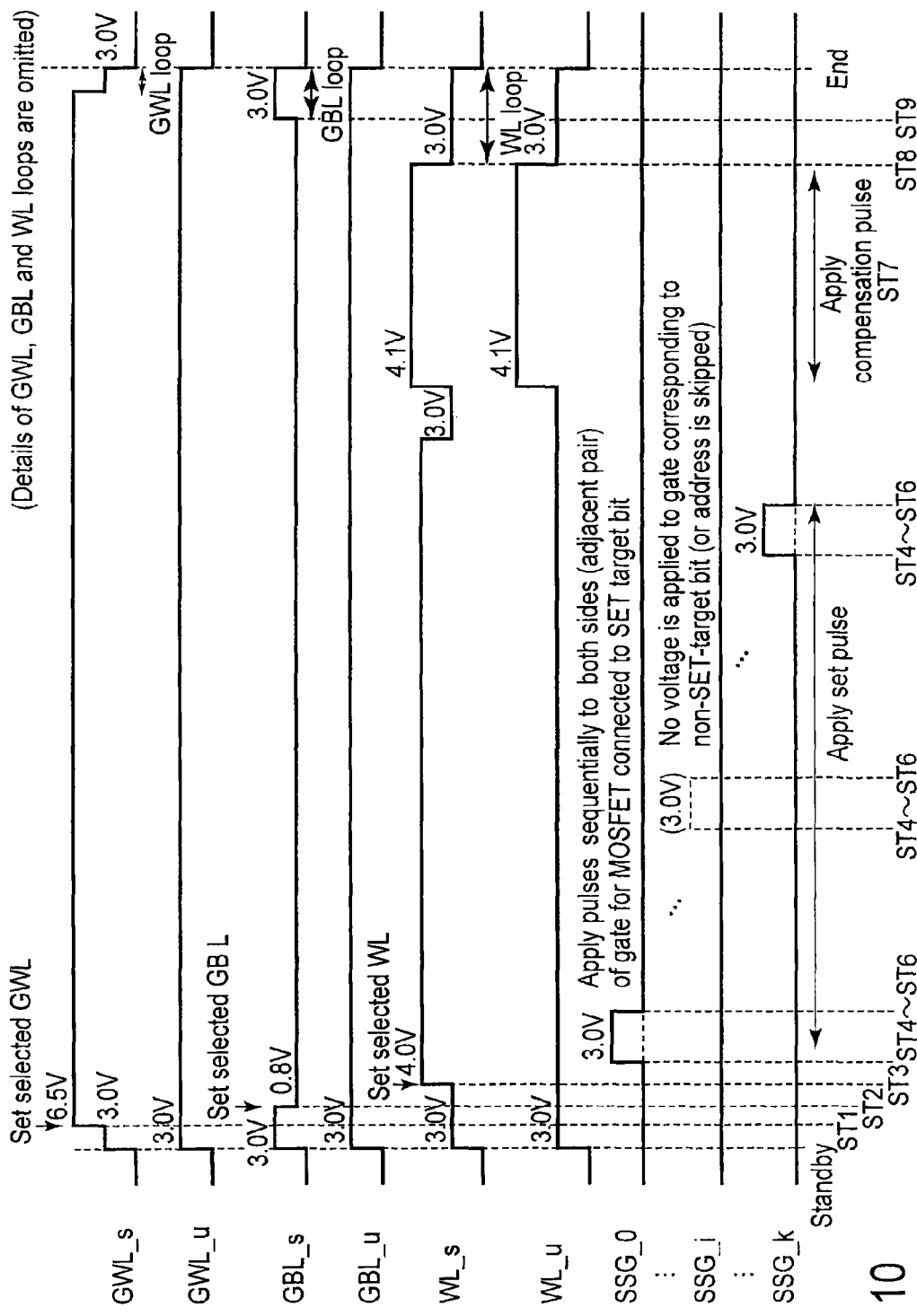
FIG. 10 is an example of a waveform diagram of a set operation and a recovering operation.
Figure 11:
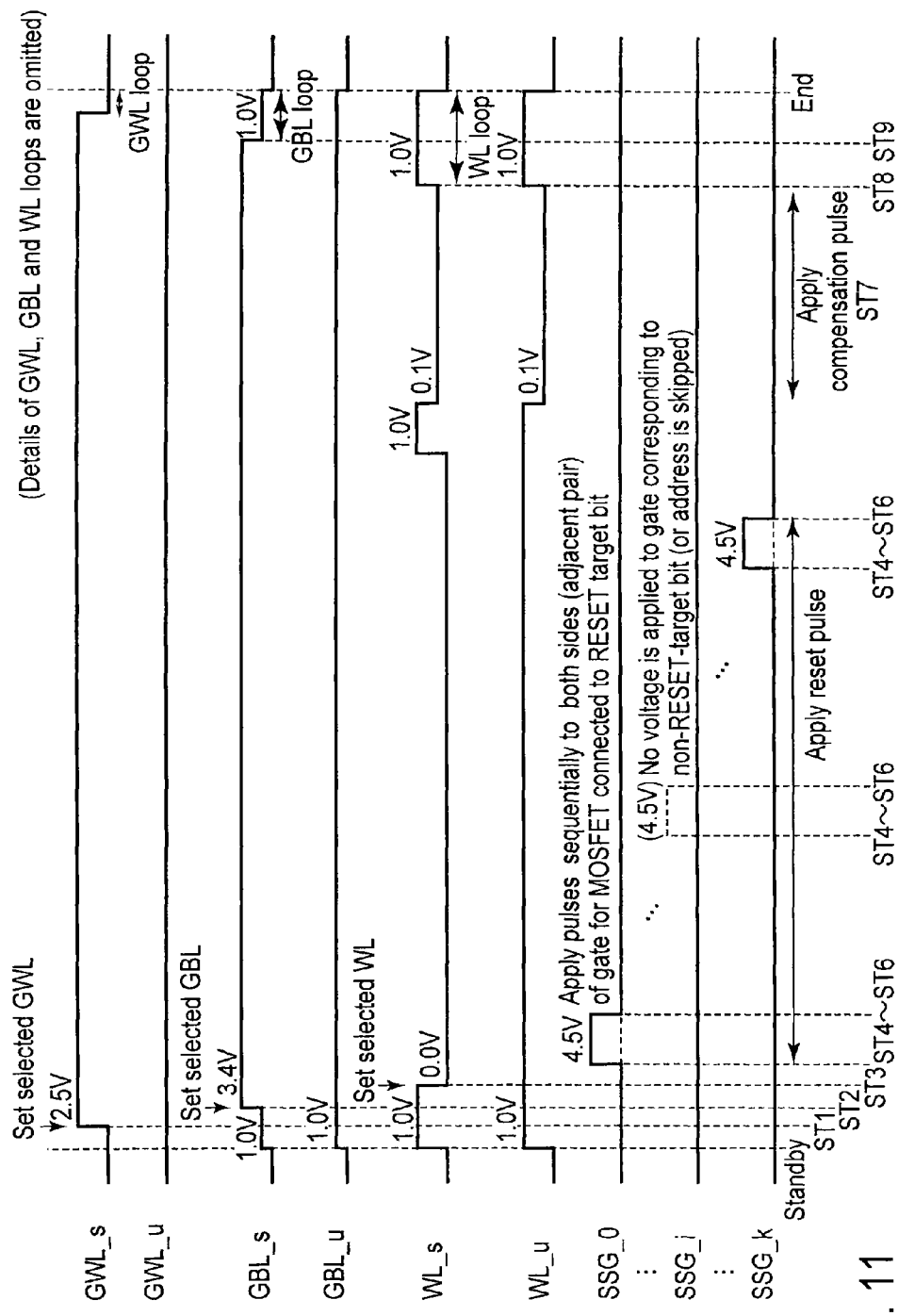
FIG. 11 is an example of a waveform diagram of a reset operation and a recovering operation.

FIG. 9 is an example of a flowchart illustrating a recovering operation of a select element according to a first embodiment. FIG. 10 illustrates an example of time dependence of each node voltage when a SET operation is executed in a loop of FIG. 9, and FIG. 11 illustrates an example of time dependence of each node voltage when a RESET operation is executed in the loop of FIG. 9.

The control circuit 25 is set to a standby state by applying an un-select voltage (for example, 3.0 V) to all of the global word lines GWL and the global bit lines GBL. Subsequently, the control circuit 25 sets a GWL address which selects a word line group. The control circuit 25, for example, sets the selected global word line to a global word line select voltage (for example, 6.5 V) (step ST1). Also, global word lines other than the selected global word line maintain the un-select voltage.

Subsequently, the control circuit 25 sets a GBL address which is to be a selected global bit line. The control circuit 25, for example, sets the selected global bit line to a global bit line select voltage (for example, 0.8 V) (step ST2). High speed can be achieved by simultaneously selecting selected global bit lines and executing a parallel operation.

Subsequently, the control circuit 25 sets a WL address which is to be a selected word line. The control circuit 25, for example, sets the selected word line to a word line select voltage (for example, 4.0 V), and sets unselected word lines, except for the selected word line, to 3.0 V as an example of an un-select voltage (unselected word line voltage) (step ST3).

Subsequently, the control circuit 25 sets a gate voltage of the select element SS according to an address of a bit line to be selected (step ST4). In the present example, the select element SS0 is selected, and the control circuit 25 applies, for example, the select voltage of 3.0 V to gate electrodes SSG_0 and SSG_1 of both sides of the select element SS0. Also, the control circuit 25 applies 0 V to gate electrodes of the unselected select elements SS. Also, since 3.0 V is applied to one gate electrode of the select element SS1 sharing the gate electrode with the select element SS0, the control circuit 25 applies 0 V to only the other gate electrode.

Also, the control circuit 25 executes SET/RESET of the select element by applying a voltage of a pulse length corresponding to SET/REST time to the gate electrode of the select element SS (step ST5). Also, the control circuit 25 repeats steps ST4 to ST6 within a sheet selector loop, and completes the SET/RESET of the selected word line (step ST6).

As a result, the memory cells c2, c3 . . . c2$n$–1 of the left diagram of FIG. 36 are sequentially selected, and the operation of one sheet selector loop is completed. Also, the gate electrode SSG_0 or the like need not maintain the select voltage between steps ST4 to ST6, and may change according to the SET/RESET operation.

Since the above steps cause a variation in the characteristic of the select element SS (for example, threshold value shift), a recovering operation of the select element SS is executed.

First, while setting the sheet selector of the selected word line group (GWL address) to the un-select voltage, the control circuit 25 sets all word lines of the group to a SET recovery voltage when SET processing is in progress, sets all word lines of the group to a RESET recovery voltage when RESET processing is in progress, and applies a compensation pulse (for example, 4.1 V) of a predetermined time (step ST7).

A processing time can be shortened because potentials of the global word line and the global bit line, whose line delay is long, can be maintained between the application of the Set pulse and the application of the compensation pulse.

A series of such processing is repeated in the other sheet selector loop, WL layer loop, and global bit line loop in a page (steps ST8 and ST9). Also, after checking whether data of the page is equal to desired data, the SET/RESET operation is completed (steps ST10 and ST11). For example, when read data is different from planned write data, the control circuit 25 repeats the loop of steps ST2 to ST10 again with respect to the different data.

Also, although the SET/RESET of page-unit data as the file memory has been described in the present embodiment, other data units such as segment unit or bit unit may also be used herein.

The set values of the voltages and the principle of recovering the characteristic variation of the select element SS will be described in more detail with reference to the illustrative drawings of FIGS. 19 to 23.

Figure 19:
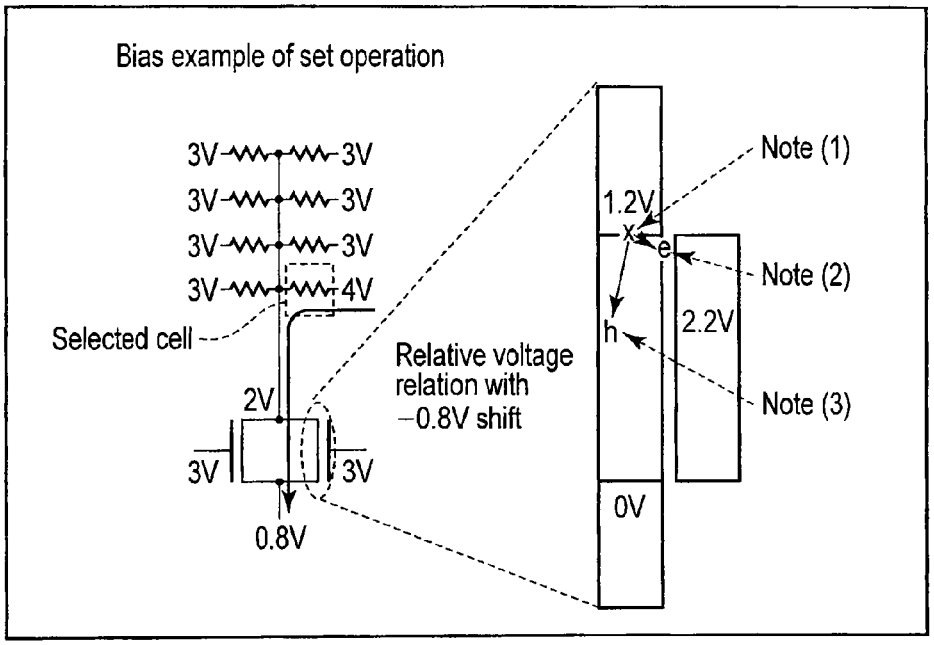
FIG. 19 is an example of a diagram illustrating a bias example of a set operation.
Figure 20:
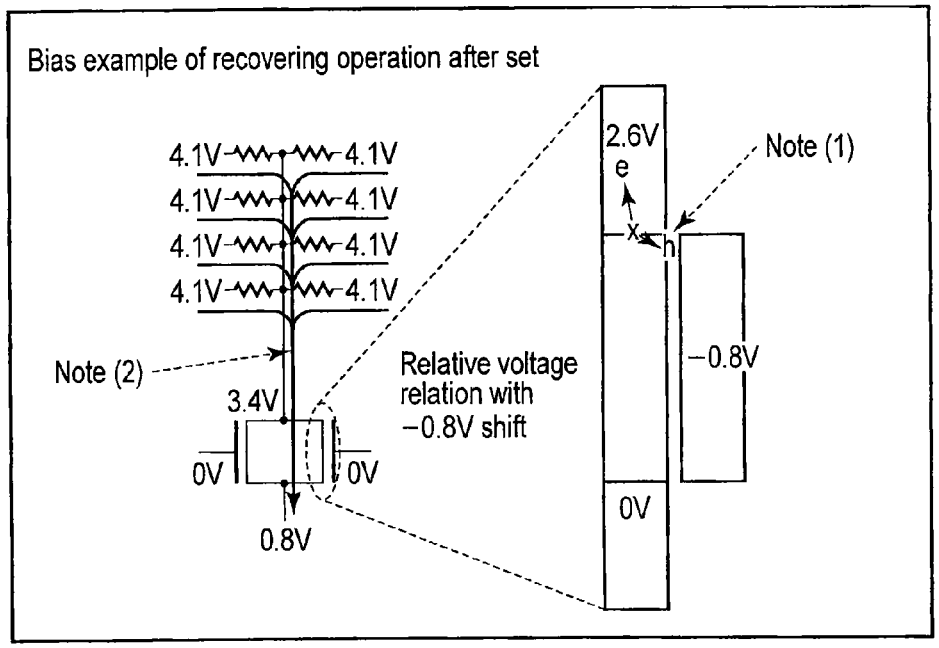
FIG. 20 is an example of a diagram illustrating a bias example of a recovering operation after a set.

FIG. 19 illustrates a bias example in the SET operation. Also, FIG. 20 illustrates a bias example in the recovering operation after the SET.

Also, as illustrated in FIG. 19, when the selected cell is set, a pulse of a predetermined SET time length is applied, for example, by setting a voltage of the selected global bit line to 0.8 V, a voltage of the unselected global bit line to 3 V, a voltage of the selected word line to 4 V, a voltage of the unselected word line to 3 V, and a voltage of the sheet selector gate voltage to 3 V.

An enlarged schematic diagram of the state of the select element at this time is illustrated in the right diagram of FIG. 19. However, in the schematic diagram, for convenience, the source voltage is set to be 0 V by lowering all voltages of the left diagram of FIG. 19 by 0.8 V.

In this case, since a drain voltage of the select element is 1.2 V, which is relatively large, impact-ionized hot carriers are generated by an electric field at the drain terminal (Note(1)), and since electrons generated by this are attracted to the gate electrode having a large voltage, electrons are easily taken into the gate oxide film near the drain (Note(2)). Therefore, if electrons are accumulated in the gate oxide film by the long-term use, there occur phenomenon such as a remarkable reduction of an ON current.

Also, holes are moved to the source of the select element by the electric field at the drain terminal and then disappeared in a grain boundary or the like (Note(3)).

Therefore, as illustrated in FIG. 20, the recovering operation after the SET applies a pulse of a predetermined time, for example, by setting a voltage of the selected global bit line to 0.8 V, a voltage of the unselected global bit line to 3 V, a voltage of the sheet selector gate voltage to 0 V, and voltages of all word lines of the word line group to 4.1 V. In this manner, the recovering processing can be simultaneously executed to all of the select elements connected to the bit lines belonging to the selected word line comb on the selected global bit line.

An enlarged schematic diagram of the state of the select element at this time is illustrated in the right diagram of FIG. 20. However, in the schematic diagram, for convenience, the source voltage is set to be 0 V by lowering all voltages of the left diagram of FIG. 20 by 0.8 V.

In this case, the gate voltage of the select element is low, but since the drain voltage is increased to 2.6 V, a sufficient punch-through current flows to the select element by impact ionization. As a result, hot carrier is generated at the drain terminal (Note(1)).

However, in the recovering operation, the gate voltage of the select element is low, as opposed to the SET operation. Therefore, not electrons but holes are attracted to the gate by a gate electric field. Therefore, holes are easily taken into the gate oxide film near the drain. Therefore, deterioration of reliability can be avoided by adjusting the pulse time of the recovering processing such that electrons accumulated in the SET operation and holes accumulated in the recovering operation are neutralized (annihilated).

Also, in the recovering processing, setting the potentials of all word lines of the word line group as well as a specific word line to 4.1 V can prevent erroneous writing and erroneous erasing to the memory cell by dispersing a current flowing in the recovering processing to parallel cells, and can increase the source-drain voltage of the select element (FET) and obtain a sufficient punch-through current even at a low gate voltage by reducing a voltage drop in the cell and the word line (Note(2)).

Figure 21:
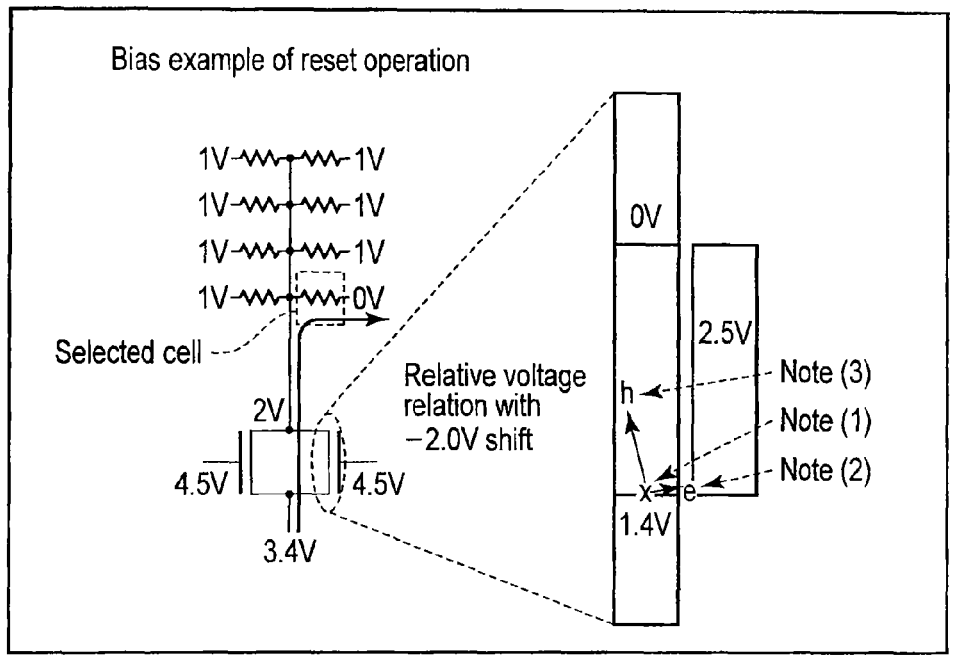
FIG. 21 is an example of a diagram illustrating a bias example of a reset operation.
Figure 22:
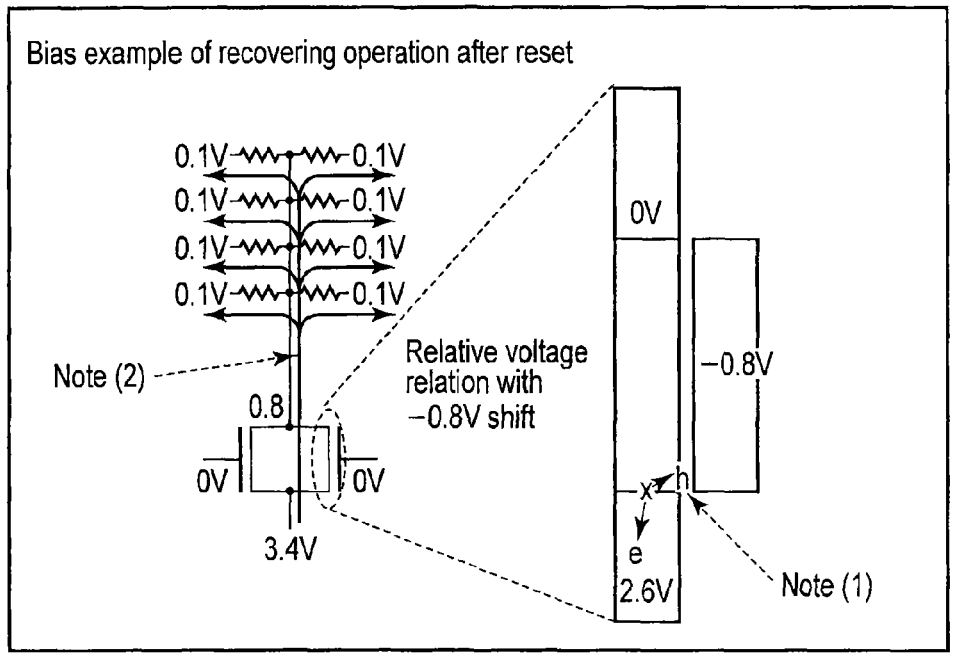
FIG. 22 is an example of a diagram illustrating a bias example of a recovering operation after a reset.

FIG. 21 illustrates a bias example in the RESET operation. Also, FIG. 22 illustrates a bias example in the recovering operation after the RESET.

In the present example, an example of the RESET operation in which the direction of the current is reversed from the case of the SET, in correspondence to the bipolar operation of the resistance change element, will be described.

Also, as illustrated in FIG. 21, when the selected cell is reset, a pulse of a predetermined RESET time length is applied, for example, by setting a voltage of the selected global bit line to 3.4 V, a voltage of the unselected global bit line to 1 V, a voltage of the selected word line to 0 V, a voltage of the unselected word line to 1 V, and a voltage of the sheet selector gate voltage to 4.5 V.

An enlarged schematic diagram of the state of the select element at this time is illustrated in the right diagram of FIG. 21. However, in the schematic diagram, for convenience, the source voltage is set to be 0 V by lowering all voltages of the left diagram of FIG. 21 by 2.0 V.

In this case, since a necessary current of the resistance change material is larger in the RESET operation than in the SET operation, the drain voltage is 1.4 V, which is slightly larger than in the SET. Therefore, as in the SET, impact-ionized hot carriers are generated by an electric field at the drain terminal (Note(1)), and since electrons generated by this are attracted to the gate having a large voltage, electrons are easily taken into the gate oxide film near the drain (Note (2)). Therefore, if electrons are accumulated in the gate oxide film by the long-term use, there occur phenomenon such as a remarkable reduction of an ON current.

Also, holes are moved to the source of the select element by the electric field at the drain terminal and then disappeared in a grain boundary or the like (Note(3)).

Therefore, as illustrated in FIG. 22, the recovering operation after the RESET applies a pulse of a predetermined time, for example, by setting a voltage of the selected global bit line to 3.4 V, a voltage of the unselected global bit line to 1 V, a voltage of the sheet selector gate voltage to 0 V, and voltages of all word lines of the word line group to 0.1 V. In this manner, the recovering processing can be simultaneously executed to all of the select elements connected to the bit lines belonging to the selected word line comb on the selected global bit line.

An enlarged schematic diagram of the state of the select element at this time is illustrated in the right diagram of FIG. 22. However, in the schematic diagram, for convenience, the source voltage is set to be 0 V by lowering all voltages of the left diagram of FIG. 22 by 0.8 V.

In this case, the gate voltage of the select element is low, but since the drain voltage is increased to 2.6 V, a sufficient punch-through current flows to the select element by impact ionization. As a result, hot carrier is generated at the drain terminal (Note(1)).

However, in the recovering operation, the gate voltage of the select element is low, as opposed to the RESET operation. Therefore, not electrons but holes are attracted to the gate by a gate electric field. Therefore, holes are easily taken into the gate oxide film near the drain. Therefore, deterioration of reliability can be avoided by adjusting the pulse time of the recovering processing such that electrons accumulated in the RESET operation and holes accumulated in the recovering operation are neutralized (annihilated).

Also, in the recovering operation, setting the potentials of all word lines of the word line group as well as a specific word line to 0.1 V can prevent erroneous writing and erroneous erasing to the memory cell by dispersing a current flowing in the recovering operation to parallel cells, and can increase the source-drain voltage of the select element (FET) and obtain a sufficient punch-through current even at a low gate voltage by reducing a voltage drop in the cell and the word line (Note (2)).

Herein, in the case of the SET operation of FIGS. 19 and 20, a location where hot carriers are easily accumulated is an edge of the gate oxide film of the bit line side of the select element (FET). On the other hand, in the case of the RESET operation of FIGS. 21 and 22, the location is an edge of the gate oxide film of the global bit line side of the select element (FET). In this regard, the use of different recovering processing in the case of the SET operation and the case of the RESET operation is one of characteristics of the present example.

FIG. 23 illustrates another bias example of the recovering operation after the SET/RESET.

The examples of FIGS. 19 to 22 are characterized in that the electrons (cause of the threshold value shift) are neutralized by holes generated by the impact ionization, that is, the punch-through current flows to the select element in the recovering operation, and the direction of the punch-through current is equal to the direction of the current flowing to the select element in the SET/RESET.

In the present example, the recovering operation of pulling out the electrons trapped in the gate oxide film of the select element by a high electric field will be described.

As illustrated in FIG. 23, the recovering operation after the SET/RESET, for example, sets a voltage of the selected global bit line to 6.0 V, a voltage of the unselected global bit line to 4 V, a voltage of the sheet selector gate voltage to 0 V, and voltages of all word lines of the word line group to 6.0 V. In this manner, the recovering processing can be simultaneously executed to all of the select elements connected to the bit lines belonging to the selected word line comb on the selected global bit line.

An enlarged schematic diagram of the state of the select element at this time is illustrated in the right diagram of FIG. 23. However, in the schematic diagram, for convenience, the source/drain voltage is set to be 0 V by lowering all voltages of the left diagram of FIG. 23 by 6.0 V.

In this case, the gate voltage of the select element is negative, but since the source/drain voltage is 0 V, the electrons in the gate oxide film are discharged to the source/drain by a strong gate electric field. Therefore, deterioration of reliability can be avoided by adjusting the recovering processing time such that electrons accumulated in the SET/RESET operations and electrons discharged in the recovering operation become substantially equal in amount.

Also, in the recovering processing, setting the potentials of all word lines of the word line group as well as a specific word line to 6.0 V reduces a voltage drop in the cell and the word line so that the source-drain voltage of the select element (FET) is equalized.

5.2 Second Embodiment

Figure 12:
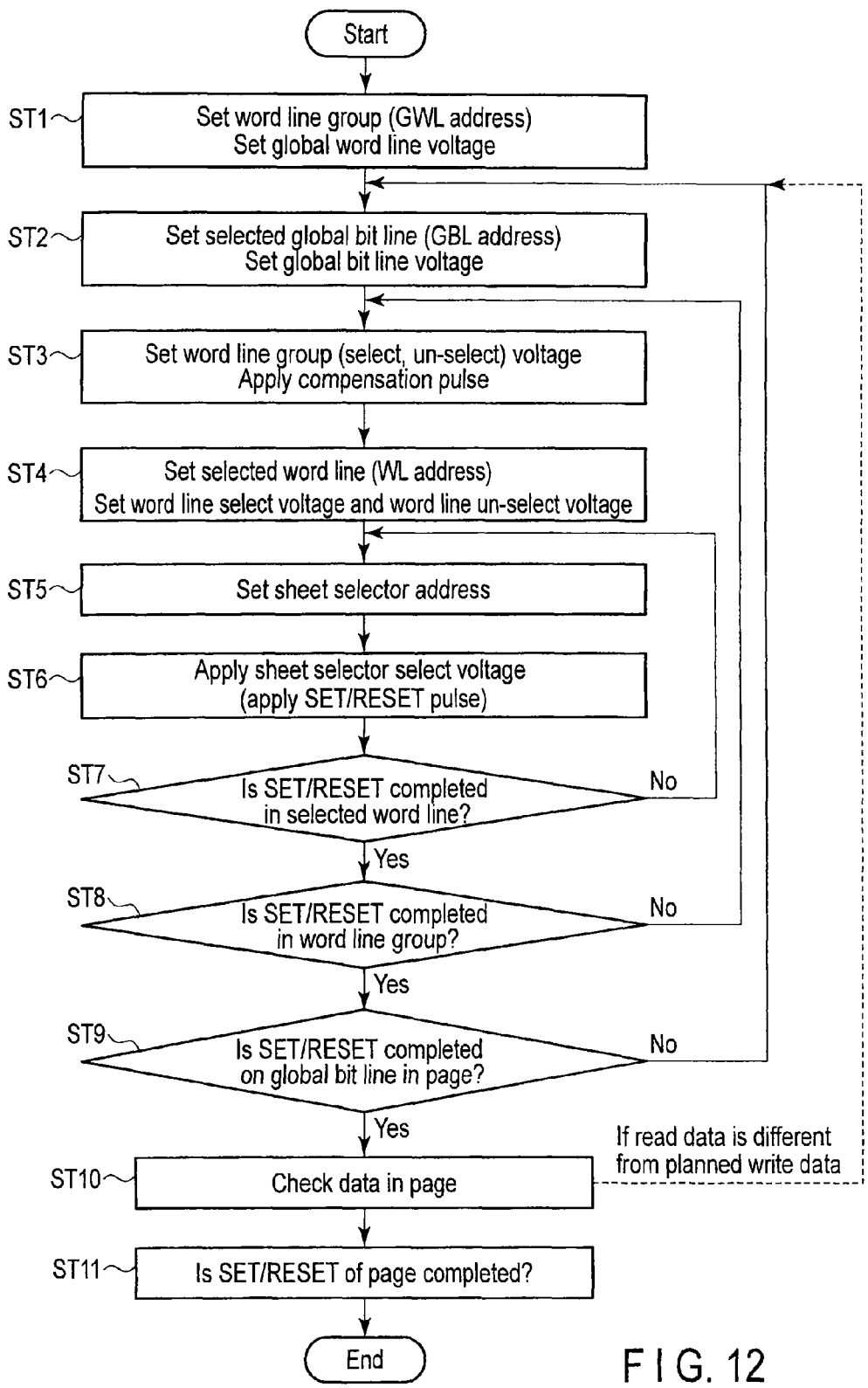
FIG. 12 is an example of a flowchart according to a second embodiment.
Figure 14:
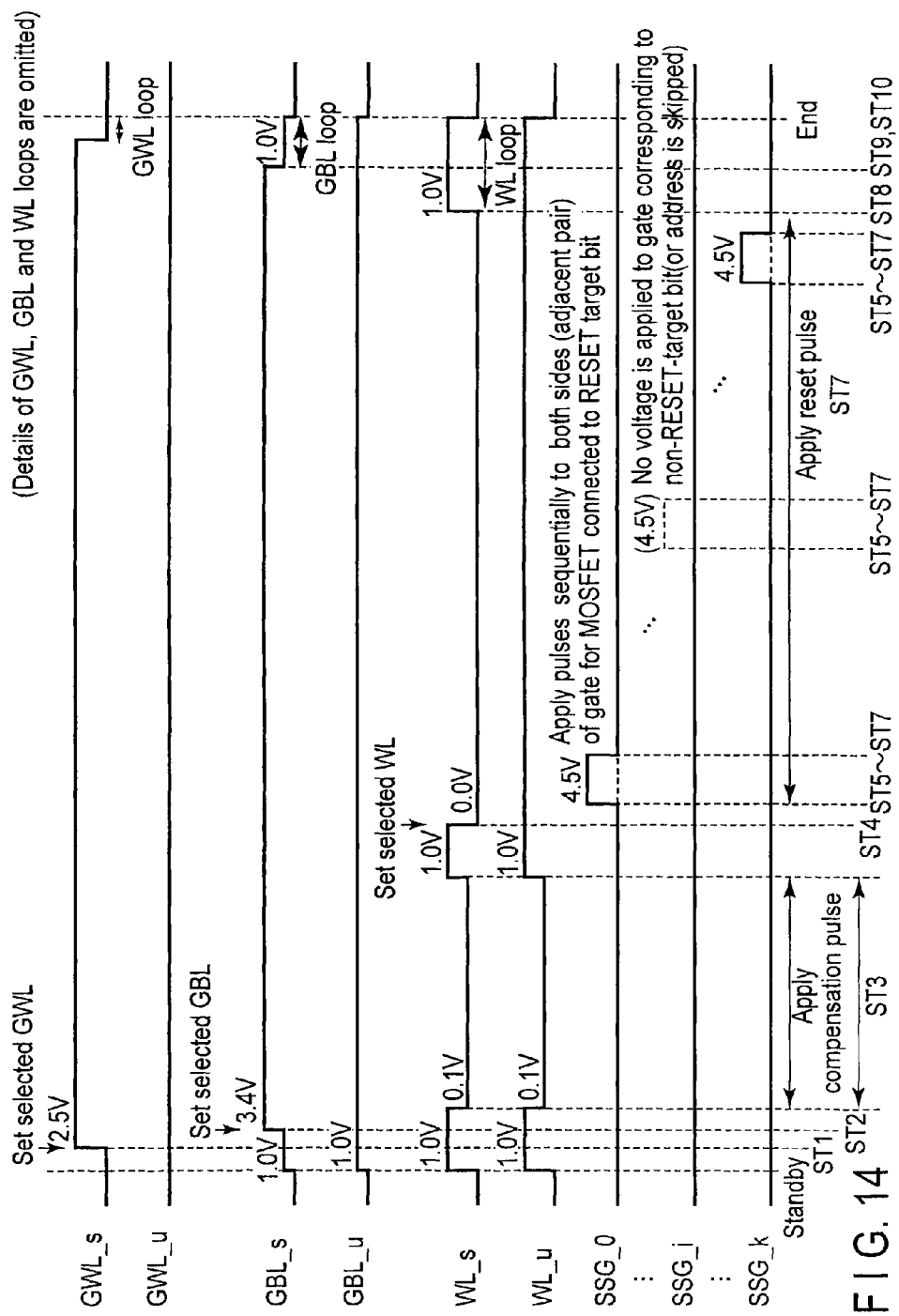
FIG. 14 is an example of a waveform diagram of a reset operation and a recovering operation.

FIG. 12 is an example of a flowchart illustrating a recovering operation of a select element according to a second embodiment. FIG. 13 illustrates an example of time dependence of each node voltage when a SET operation is executed in a loop of FIG. 12, and FIG. 14 illustrates an example of time dependence of each node voltage when a RESET operation is executed in the loop of FIG. 12.

The present example is characterized in that the application of the compensation pulse for the recovering processing (the neutralization of the threshold value shift) and the application of the SET/RESET pulses are reverse to the first embodiment.

The control circuit 25 is set to a standby state by applying an un-select voltage (for example, 3.0 V) to all of the global word lines GWL and the global bit lines GBL. Subsequently, the control circuit 25 sets a GWL address which selects a word line group. The control circuit 25, for example, sets the selected global word line to a global word line select voltage (for example, 6.5 V) (step ST1). Also, global word lines other than the selected global word line maintain the un-select voltage.

Subsequently, the control circuit 25 sets a GBL address which is to be a selected global bit line. The control circuit 25, for example, sets the selected global bit line to a global bit line select voltage (for example, 0.8 V) (step ST2). High speed can be achieved by simultaneously selecting a plurality of selected global bit lines and executing a parallel operation.

Subsequently, the control circuit 25 performs characteristic variation (for example, threshold value shift recovering operation) of the select element SS, which is generated by the SET/RESET operations.

First, while setting the sheet selector gate of the selected word line group (GWL address) to the un-select voltage, the control circuit 25 sets all word lines of the group to a SET recovery voltage when SET processing is in progress, sets all word lines of the group to a RESET recovery voltage when RESET processing is in progress, and applies a compensation pulse (for example, 4.1 V) of a predetermined time (step ST3).

A processing time can be shortened because potentials of the global word line and the global bit line, whose line delay is long, can be maintained between the application of the Set pulse and the application of the compensation pulse.

Subsequently, the control circuit 25 sets a WL address which is to be a selected word line. The control circuit 25, for example, sets the selected word line to a word line select voltage (for example, 4.0 V), and sets unselected word lines, except for the selected word line, to 3.0 V as an example of an un-select voltage (unselected word line voltage) (step ST4).

Subsequently, the control circuit 25 sets a gate voltage of the select element SS according to an address of a bit line to be selected (step ST5). In the present example, the select element SS0 is selected, and the control circuit 25 applies, for example, the select voltage of 3.0 V to gate electrodes SSG_0 and SSG_1 of both sides of the select element SS0. Also, the control circuit 25 applies 0 V to gate electrodes of the unselected select elements SS. Also, since 3.0 V is applied to one gate electrode of the select element SS1 sharing the gate electrode with the select element SS0, the control circuit 25 applies 0 V to only the other gate electrode.

Also, the control circuit 25 executes SET/RESET of the select element by applying a voltage of a pulse length corresponding to SET/REST time to the gate electrode of the select element SS (step ST6). Also, the control circuit 25 repeats steps ST5 to ST7 within a sheet selector loop, and completes the SET/RESET of the selected word line (step ST8).

As a result, the memory cells c2, c3 . . . c2n−1 of the left diagram of FIG. 36 are sequentially selected, and the operation of one sheet selector loop is completed. Also, the gate electrode SSG_0 or the like need not maintain the select voltage between steps ST5 to ST7, and may change according to the SET/RESET operation.

A series of such processing is repeated in the other sheet selector loop, WL layer loop, and global bit line loop in a page (steps ST8 and ST9). Also, after checking whether data of the page is equal to desired data, the SET/RESET operation is completed (steps ST10 and ST11). For example, when read data is different from planned write data, the control circuit 25 repeats the loop of steps ST2 to ST10 again with respect to the different data.

Also, although the SET/RESET of page-unit data as the file memory has been described in the present embodiment, other data units such as segment unit or bit unit may also be used herein.

Since the set values of the voltages and the principle of recovering the characteristic variation of the select element SS have already been described in detail with reference to the illustrative drawings of FIGS. 19 to 23, a description thereof will be omitted herein. In the second embodiment, the recovering operation of the select element SS is executed before the set/reset operations. As a result, since the set/reset operations are executed after the characteristic of the select element SS is recovered, the set/reset operation can be accurately executed.

5.3 Third Embodiment

Figure 15:
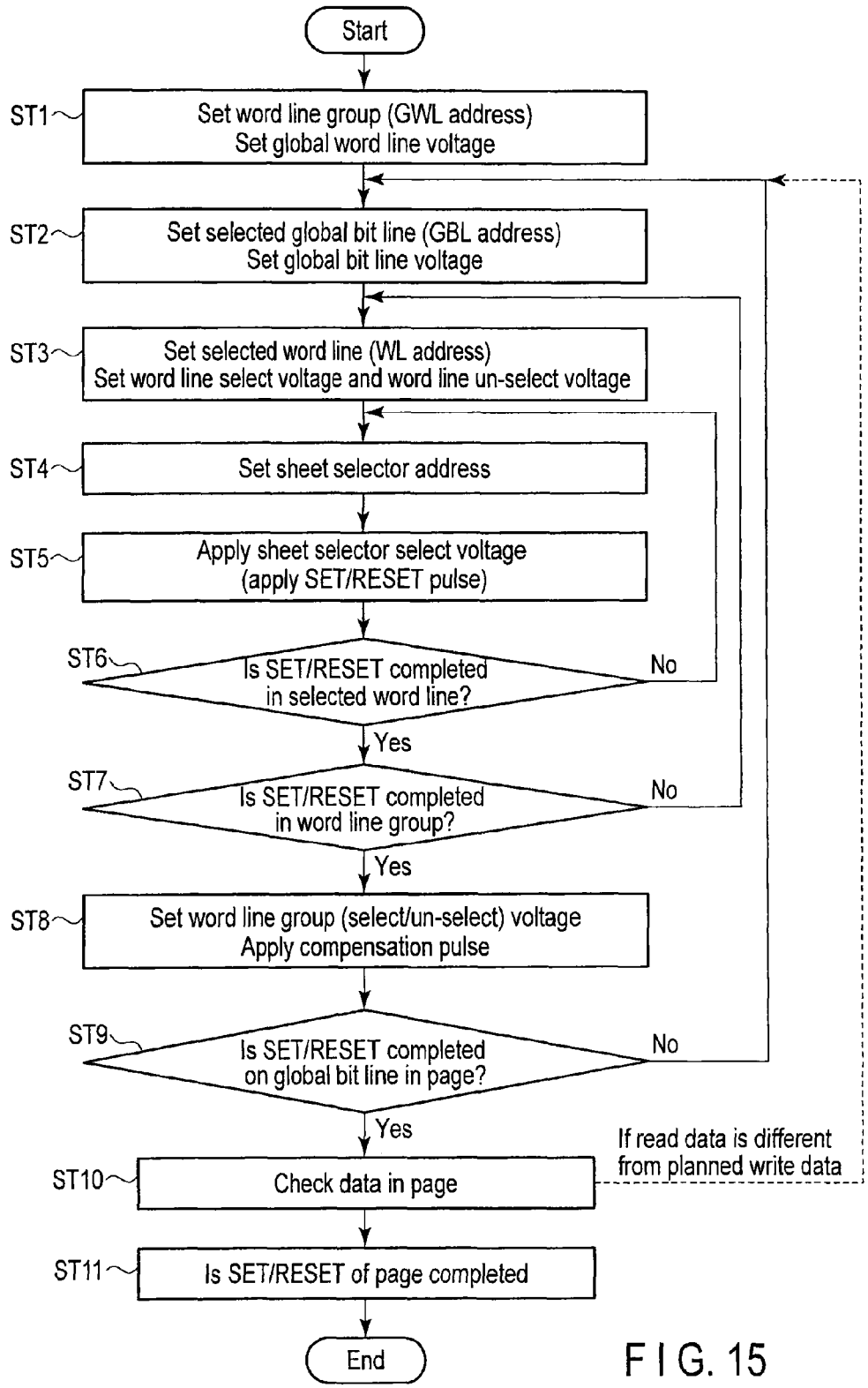
FIG. 15 is an example of a flowchart according to a third embodiment.
Figure 16:
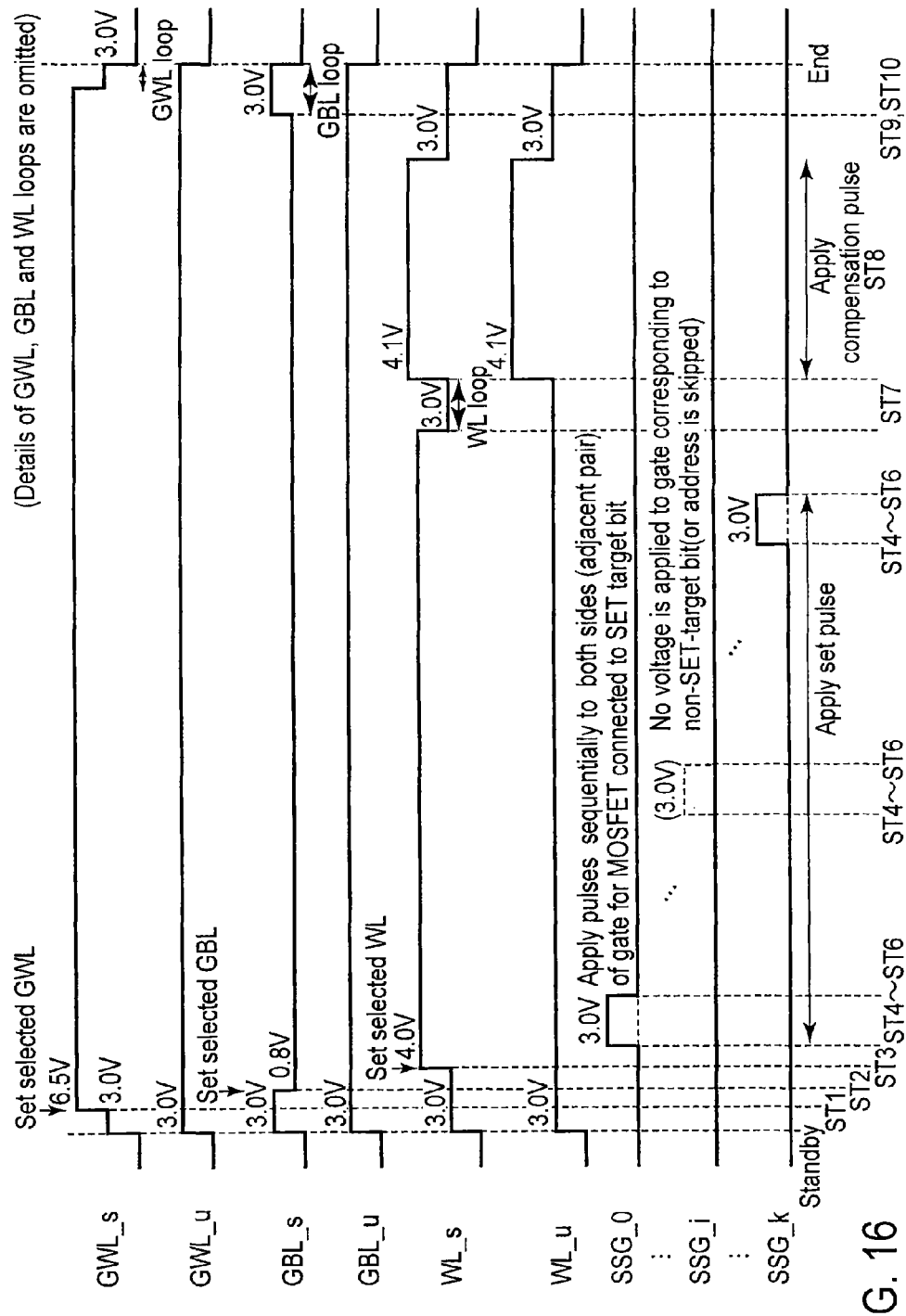
FIG. 16 is an example of a waveform diagram of a set operation and a recovering operation.

FIG. 15 is an example of a flowchart illustrating a recovering operation of a select element according to a third embodiment. FIG. 16 illustrates an example of time dependence of each node voltage when a SET operation is executed in a loop of FIG. 15, and FIG. 17 illustrates an example of time dependence of each node voltage when a RESET operation is executed in the loop of FIG. 15.

The present example is characterized in that the application of the compensation pulse for performing the recovering processing is arranged outside the loop of checking whether the SET/RESET of the word line group is completed. This is effective when the recovering operation need not be frequently executed, because it is less likely that the characteristic variation of the select FET will occur or the write margin of the SET/RESET operation is large even when the characteristic of the select FET is varied. As a result, necessary time of SET/RESET can be reduced by reducing the recovering processing time.

The control circuit 25 is set to a standby state by applying an un-select voltage (for example, 3.0 V) to all of the global word lines GWL and the global bit lines GBL. Subsequently, the control circuit 25 sets a GWL address which selects a word line group. The control circuit 25, for example, sets the selected global word line to a global word line select voltage (for example, 6.5 V) (step ST1). Also, global word lines other than the selected global word line maintain the un-select voltage.

Subsequently, the control circuit 25 sets a GBL address which is to be a selected global bit line. The control circuit 25, for example, sets the selected global bit line to a global bit line select voltage (for example, 0.8 V) (step ST2). High speed can be achieved by simultaneously selecting a plurality of selected global bit lines and executing a parallel operation.

Subsequently, the control circuit 25 sets a WL address which is to be a selected word line. The control circuit 25, for example, sets the selected word line to a word line select voltage (for example, 4.0 V), and sets unselected word lines, except for the selected word line, to 3.0 V as an example of an un-select voltage (unselected word line voltage) (step ST3).

Subsequently, the control circuit 25 sets a gate voltage of the select element SS according to an address of a bit line to be selected (step ST4). In the present example, the select element SS0 is selected, and the control circuit 25 applies, for example, the select voltage of 3.0 V to gate electrodes SSG_0 and SSG_1 of both sides of the select element SS0. Also, the control circuit 25 applies 0 V to gate electrodes of the unselected select elements SS. Also, since 3.0 V is applied to one gate electrode of the select element SS1 sharing the gate electrode with the select element SS0, the control circuit 25 applies 0 V to only the other gate electrode.

Also, the control circuit 25 executes SET/RESET of the select element by applying a voltage of a pulse length corresponding to SET/REST time to the gate electrode of the select element SS (step ST5). Also, the control circuit 25 repeats steps ST4 to ST6 within a sheet selector loop, and completes the SET/RESET of the selected word line (step ST6).

As a result, the memory cells c2, c3 . . . c2n−1 of the left diagram of FIG. 36 are sequentially selected, and the operation of one sheet selector loop is completed. Also, the gate electrode SSG_0 or the like need not maintain the select voltage between steps ST4 to ST6, and may change according to the SET/RESET operation.

A series of such processing is repeated in the other sheet selector loop and WL layer loop (step ST7).

Since the above steps may cause a variation in the characteristic of the select element SS (for example, threshold value shift), a recovering operation of the select element SS is executed.

First, while setting the sheet selector of the selected word line group (GWL address) to the un-select voltage, the control circuit 25 sets all word lines of the group to a SET recovery voltage when SET processing is in progress, sets all word lines of the group to a RESET recovery voltage when RESET processing is in progress, and applies a compensation pulse (for example, 4.1 V) of a predetermined time (step ST8).

A processing time can be shortened because potentials of the global word line and the global bit line, whose line delay is long, can be maintained between the application of the Set pulse and the application of the compensation pulse.

Also, a series of such processing is repeated in the global bit line loop in a page (step ST9). After checking whether data of the page is equal to desired data (step ST10), the SET/RESET operation is completed (step ST11). For example, when read data is different from planned write data, the control circuit 25 repeats the loop of steps ST2 to ST10 again with respect to the different data.

Also, although the SET/RESET of page-unit data as the file memory has been described in the present embodiment, other data units such as segment unit or bit unit may also be used herein.

Since the set values of the voltages and the principle of recovering the characteristic variation of the select element SS have already been described in detail with reference to the illustrative drawings of FIGS. 19 to 23, a description thereof will be omitted herein.

In the present example, after the SET/RESET operations of the word line group is completed, the adjustment of the characteristic variation (for example, threshold value shift) of the select element SS is executed in batch with respect to all word lines WL of the group. As a result, the processing time can be shortened.

5.4 Fourth Embodiment

Figure 18:
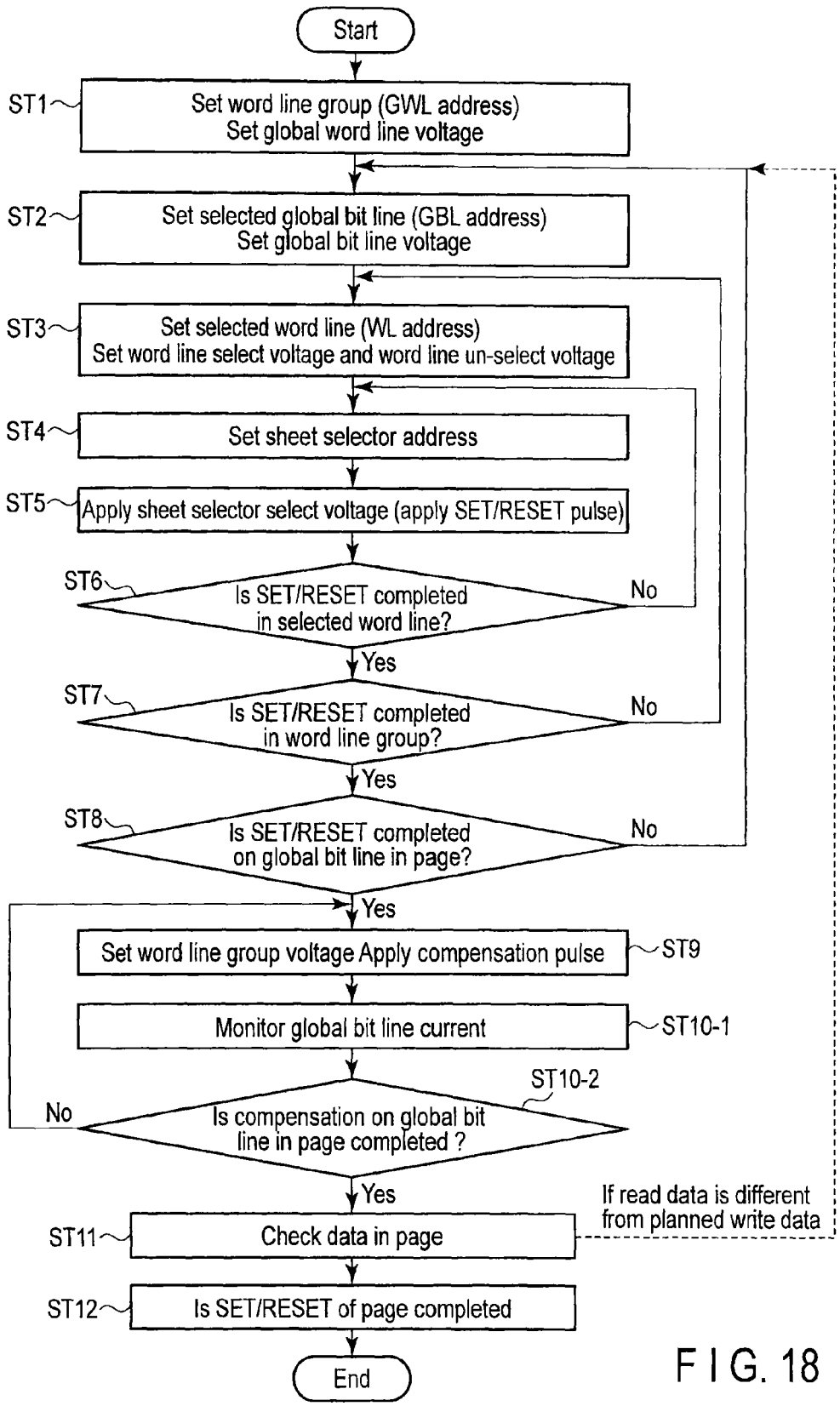
FIG. 18 is an example of a flowchart according to a fourth embodiment.
Figure 38:
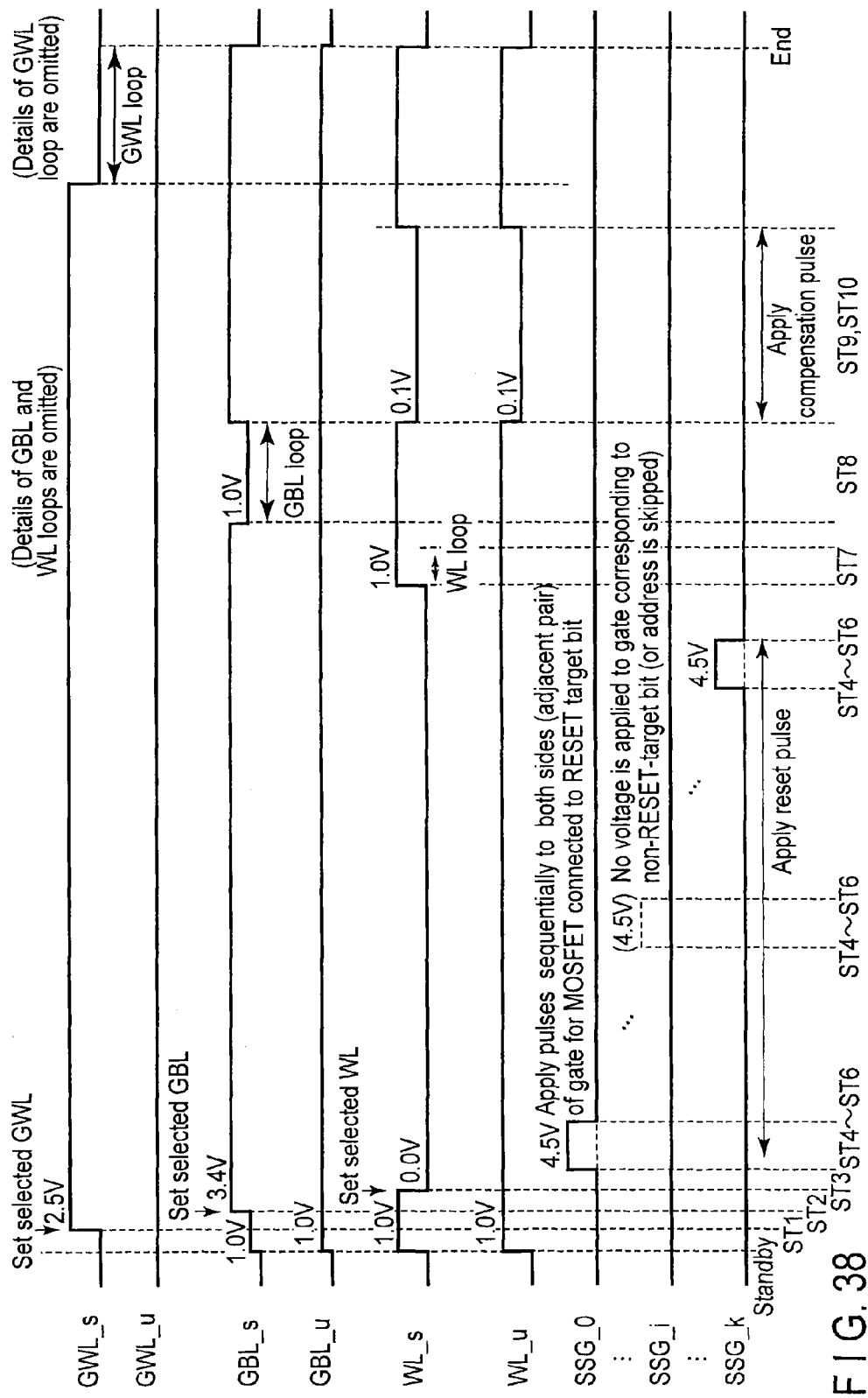
FIG. 38 is an example of a waveform diagram of a reset operation and a recovering operation.

FIG. 18 is an example of a flowchart illustrating a recovering operation of a select element according to a fourth embodiment. FIG. 37 illustrates an example of time dependence of each node voltage when a SET operation is executed in a loop of FIG. 18. FIG. 38 illustrates an example of time dependence of each node voltage when a RESET operation is executed in a loop of FIG. 18.

The present example is characterized in that the application of the compensation pulse for performing the recovering processing is provided independently of the global bit line loop (SET/RESET loop).

The control circuit 25 is set to a standby state by applying an un-select voltage (for example, 3.0 V) to all of the global word lines GWL and the global bit lines GBL. Subsequently, the control circuit 25 sets a GWL address which selects a word line group. The control circuit 25, for example, sets the selected global word line to a global word line select voltage (for example, 6.5 V) (step ST1). Also, global word lines other than the selected global word line maintain the un-select voltage.

Subsequently, the control circuit 25 sets a GBL address which is to be a selected global bit line. The control circuit 25, for example, sets the selected global bit line to a global bit line select voltage (for example, 0.8 V) (step ST2). High speed can be achieved by simultaneously selecting a plurality of selected global bit lines and executing a parallel operation.

Subsequently, the control circuit 25 sets a WL address which is to be a selected word line. The control circuit 25, for example, sets the selected word line to a word line select voltage (for example, 4.0 V), and sets unselected word lines, except for the selected word line, to 3.0 V as an example of an un-select voltage (unselected word line voltage) (step ST3).

Subsequently, the control circuit 25 sets a gate voltage of the select element SS according to an address of a bit line to be selected (step ST4). In the present example, the select element SS0 is selected, and the control circuit 25 applies, for example, the select voltage of 3.0 V to gate electrodes SSG_0 and SSG_1 of both sides of the select element SS0. Also, the control circuit 25 applies 0 V to gate electrodes of the unselected select elements SS. Also, since 3.0 V is applied to one gate electrode of the select element SS1 sharing the gate electrode with the select element SS0, the control circuit 25 applies 0 V to only the other gate electrode.

Also, the control circuit 25 executes SET/RESET of the select element by applying a voltage of a pulse length corresponding to SET/REST time to the gate electrode of the select element SS (step ST5). Also, the control circuit 25 repeats steps ST4 to ST6 within a sheet selector loop, and completes the SET/RESET of the selected word line (step ST6).

As a result, the memory cells c2, c3 . . . c2n−1 of the left diagram of FIG. 36 are sequentially selected, and the operation of one sheet selector loop is completed. Also, the gate electrode SSG_0 or the like need not maintain the select voltage between steps ST4 to ST6, and may change according to the SET/RESET operation.

A series of such processing is repeated in the other sheet selector loop, WL layer loop, and global bit line loop in a page (steps ST7 and ST8).

Since a variation in the characteristic of the select element SS (for example, threshold value shift) may occur after the above steps, a recovering operation of the select element SS is executed.

First, while setting the sheet selector of the selected word line group (GWL address) to the un-select voltage, the control circuit 25 sets all word lines of the group to a SET recovery voltage when SET processing is in progress, sets all word lines of the group to a RESET recovery voltage when RESET processing is in progress, and applies a compensation pulse (for example, 4.1 V) of a predetermined time (step ST9).

Also, before a read operation for checking data inside the page (step ST11), whether the recovering processing has been completed is checked by monitoring a current flowing through the global bit line, for example, by using a current detection circuit connected to the global bit line (step ST10-1). When the recovering processing (neutralization of threshold value shift) is insufficient, the application of the compensation pulse is executed again, and the characteristic variation of the select FET is fully recovered. A series of such processing is repeated in a global bit line loop in a page (step ST10-2).

Also, after checking whether data of the page is equal to desired data, the SET/RESET operation is completed (steps ST11 and ST12). For example, when read data is different from planned write data, the control circuit 25 repeats the loop of steps ST2 to ST11 again with respect to the different data.

Since the set values of the voltages and the recovering principle of neutralizing the characteristic variation of the select element SS have already been described in detail with reference to the illustrative drawings of FIGS. 19 to 23, a description thereof will be omitted herein.

In the present example, since the adjustment of the characteristic variation of the select element SS (for example, threshold value shift) is executed immediately before the read processing (check data in the page, step ST11) (there are no application of the SET/RESET pulse between the application of the last compensation pulse and the read processing), the influence of the characteristic variation can be further reduced.

6. MANUFACTURING METHOD

Next, a method of manufacturing the storage device according to the above-mentioned embodiment will be described.

FIGS. 24 to 35 illustrate each process of the method of manufacturing the storage device.

First, for example, a general CMOS circuit, which controls an operation of a ReRAM, is formed on a silicon substrate. Subsequently, an interlayer insulating layer is formed on the silicon substrate to cover the CMOS circuit. The following manufacturing method relates to a structure over the interlayer insulating layer.

First, as illustrated in FIG. 24, a global bit line film 40 is formed on the interlayer insulating layer. The global bit line film corresponds to the global bit line GBL described with reference to FIG. 1. As an example, the global bit line film 40 is formed using tungsten (W) and a TiN film as a barrier metal.

Subsequently, an $n^+$ type silicon layer 42, a $p^-$ type silicon layer 43, and an $n^+$ type silicon layer 44 are sequentially formed on the global bit line film 40. The silicon layers 42 to 44 correspond to the source region 5, the channel region 6, and the drain region 7 respectively, which have been described with reference to FIG. 1.

The silicon layers 42 and 44 have a dopant concentration of, for example, about $1 \times 10^{20}$ cm$^{-3}$, and a film thickness of, for example, about 40 nm. The silicon layer 43 has a dopant concentration of, for example, about $1 \times 10^{18}$ cm$^{-3}$, and a film thickness of, for example, about 120 nm. Subsequently, an annealing is performed under the condition of, for example, about 750° C. and 60 seconds, to crystallize the silicon layers 42 to 44.

Subsequently, as illustrated in FIG. 25, the silicon layers 42 to 44 and the global bit line film 40 are patterned by a photolithography technique and an RIE technique. In this manner, a global bit line 40 (GBL) having a stripe shape extending in a first direction is formed. Also, a line width and an adjacent spacing of the global bit line GBL are, for example, about 20 nm, a film thickness thereof is, for example, about 150 nm, and a sheet resistance thereof is, for example, about 1.5 ohm.

Subsequently, as illustrated in FIG. 26, an interlayer insulating layer 58 is formed on an entire surface. Subsequently, the interlayer insulating layer 58 is polished by a CMP method or the like, and an upper surface of the silicon layer 44 is exposed. By the present process, a recess portion formed in the process of FIG. 25 is filled with the interlayer insulating layer 58. Also, the silicon layers 42, 43 and 44 and the interlayer insulating layer 58 are patterned in a stripe shape extending a second direction by using a photolithography technique and an RIE technique.

As a result of the present process, the silicon layers 42, 43 and 44 are separated from each select element SS. Also, the patterning process is performed, for example, under the condition that a line width is about 16 nm and an adjacent spacing is about 24 nm (a half pitch is 20 nm). At a bottom of the recess 45 formed by the present process, the global bit line 40 and the interlayer insulating layer 58 are exposed.

Subsequently, as illustrated in FIG. 27, an insulating layer 46 (for example, a silicon oxide film) is formed on an entire surface. Subsequently, the insulating layer 46 is etched backed so that the insulating layer 46 remains only at the bottom of the recess 45. A film thickness of the remaining insulating layer 46 is, for example, about 30 nm. Therefore, a part of the silicon layer 42 and side surfaces of the silicon layers 43 and 44 are exposed in the inside of the recess 45.

Figure 28:
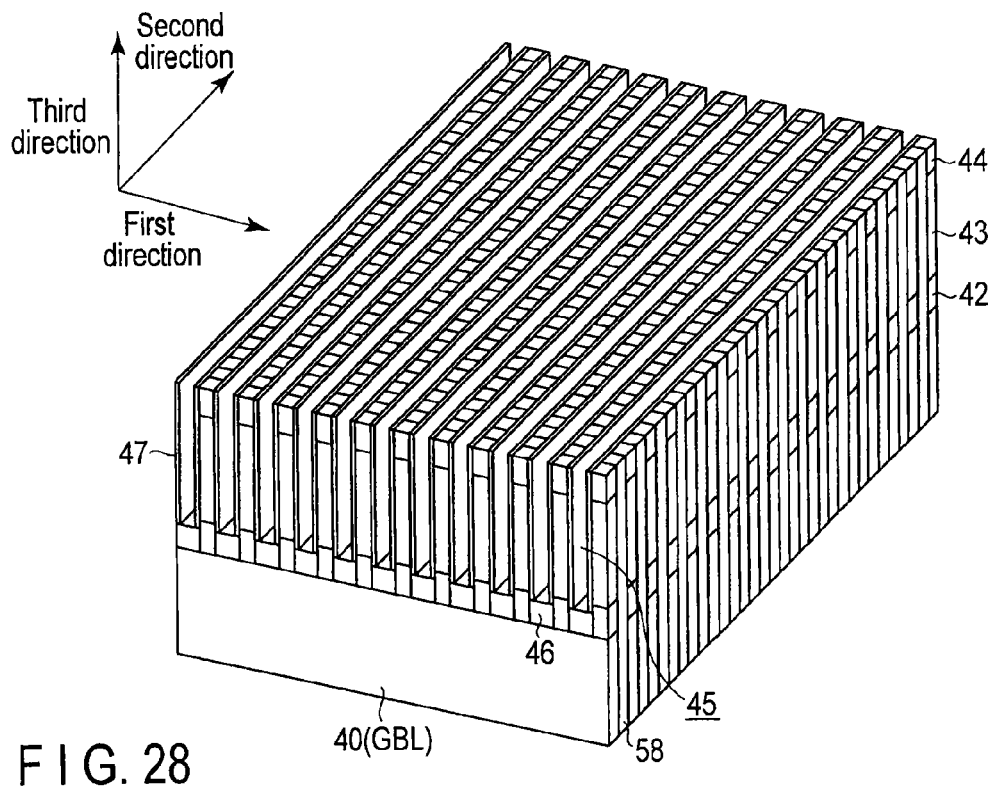

Subsequently, as illustrated in FIG. 28, an insulating layer 47 is formed on an entire surface. The insulating layer 47 corresponds to the gate insulating layer 9 described with reference to FIG. 1. Subsequently, the upper surface of the silicon layer 44 and the insulating layer 47 on the insulating layer 46 are removed so that the insulating layer 47 remains only at the side surface of the recess 45.

Figure 29:
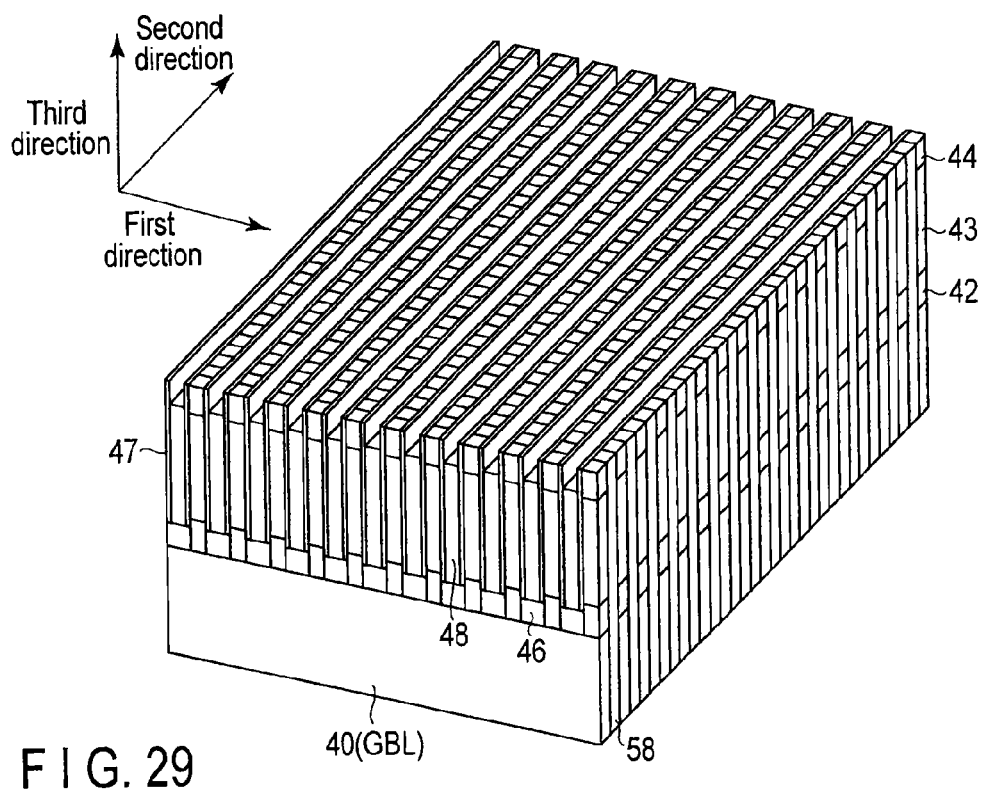

Subsequently, as illustrated in FIG. 29, the inside of the recess 45 is filled with a conductive film 48. The conductive film 48 is, for example, an $n^+$ type polycrystalline silicon layer, and corresponds to the select gate line SSG described with reference to FIG. 1. Subsequently, an upper surface of the conductive film 48 is etched back so that a film thickness of the conductive film 48 becomes, for example, about 140 nm.

By the present process, a lower surface of the conductive film 48 becomes lower than an interface of the silicon layers 42 and 43, and an upper surface of the conductive film 48 becomes higher than an interface of the silicon layers 43 and 44.

Subsequently, as illustrated in FIG. 30, an insulating layer 49 (for example, a silicon oxide film) is formed on an entire surface. Subsequently, the insulating layer 49 is polished by, for example, a CMP method so that the insulating layer 49 remains only within the recess 45. As a result, the upper surface of the silicon layer 44 is exposed.

Subsequently, as illustrated in FIG. 31, an insulating layer 51 (for example, a silicon oxide film) having a film thickness of, for example, 20 nm, is formed on the silicon layer 44 and the insulating layers 49 and 58. Subsequently, word line films 52 of sixteen layers are formed on the insulating layer 51. The word line film 52 corresponds to the word line WL described with reference to FIG. 1.

Also, the word line film 52 is formed using, for example, TiN as a material, and a film thickness thereof is, for example, about 10 nm. Also, an insulating layer 53 (for example, silicon oxide film) having a film thickness of, for example, 7 nm is formed between the stacked word line films 52. Subsequently, an insulating layer 54 (for example, silicon oxide film) having a film thickness of, for example, 13 nm is formed on the word line film 52 of the uppermost layer (sixteenth layer in the present example).

Figure 32:
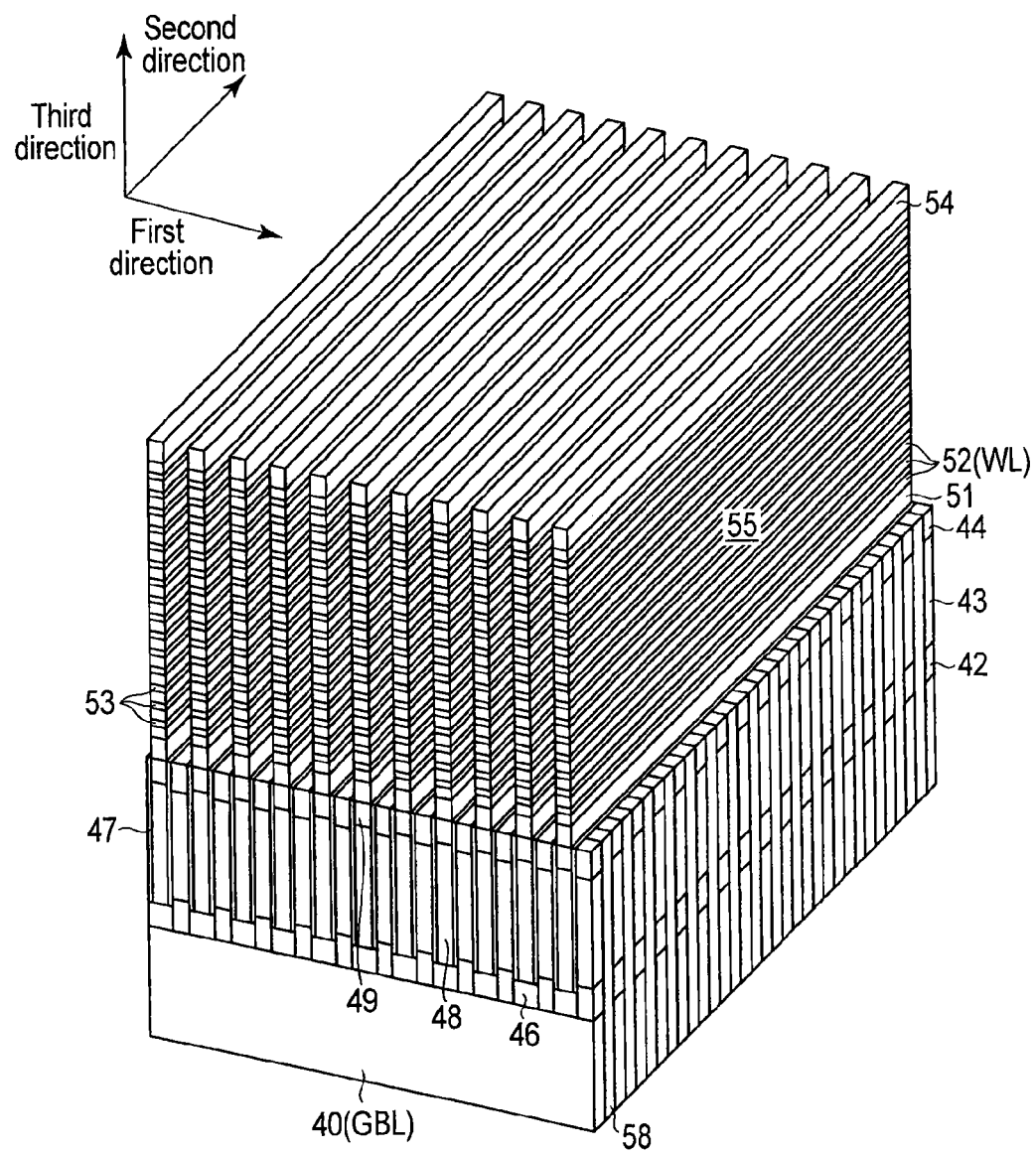

Subsequently, as illustrated in FIG. 32, the insulating layers 54, 53 and 51 and the word line film 52 are patterned in a stripe shape along a second direction by a photolithography technique and an RIE technique. The present patterning process is performed, for example, under the condition that a line width is about 15 nm and an adjacent spacing is about 25 nm (a half pitch is 20 nm).

Also, the present process is performed such that the insulating layers 54, 53 and 51 and the word line film 52 remain on the underlying insulating layer 49. As a result of the present process, the word line WL is formed, and simultaneously, the upper surfaces of the silicon layer 44 and the insulating layers 58 and 47 are exposed at the bottom of the recess 55 formed by the patterning.

Figure 33:
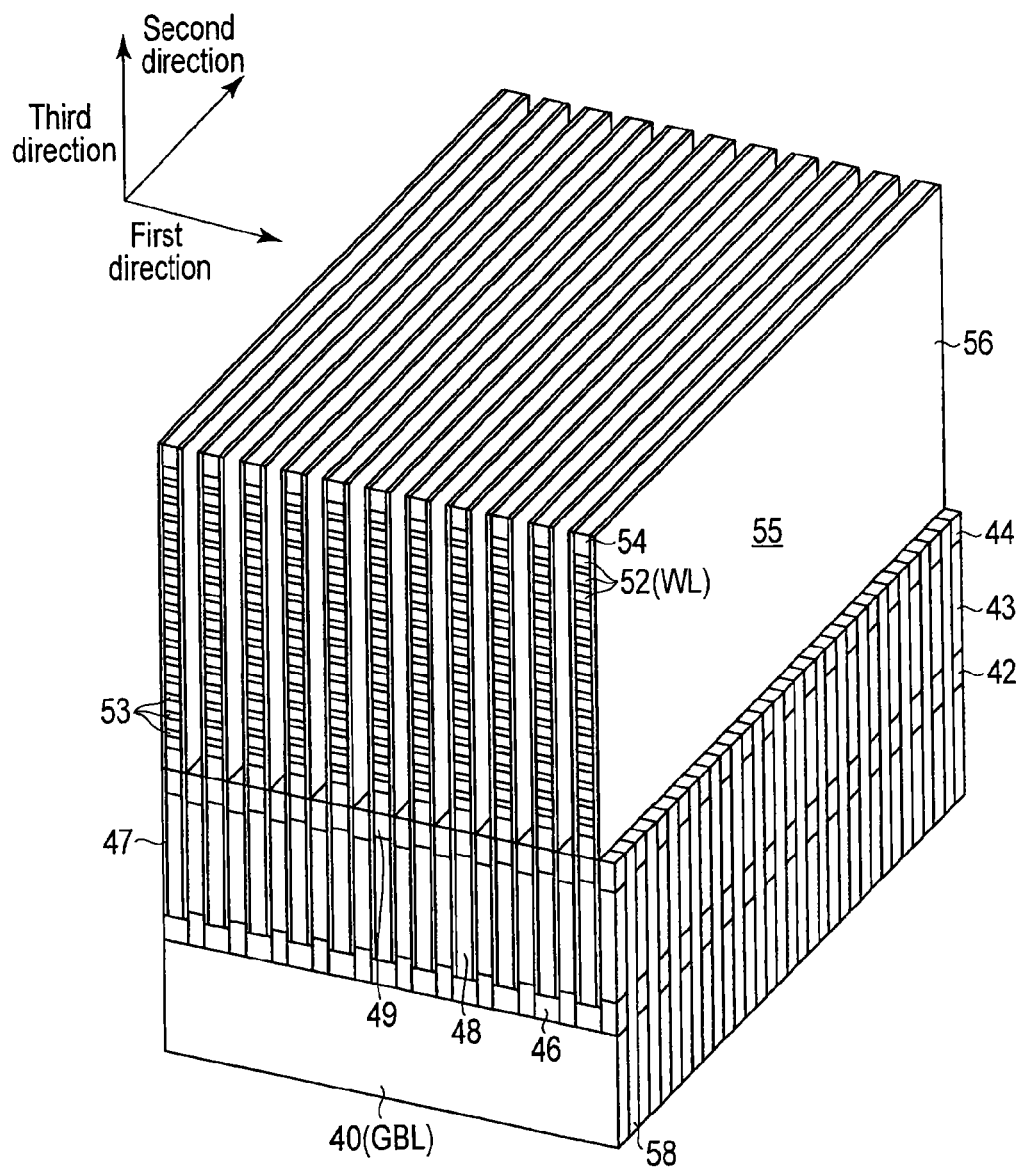

Subsequently, as illustrated in FIG. 33, resistance change material 56 is formed on the lower surface and side surface of the recess 55 and the upper surface of the insulating layer 54.

The resistance change material 56 corresponds to the resistance change material 4 described with reference to FIG. 1. The resistance change material is formed to a film thickness of, for example, about 4 nm, and is formed not to bury the recess 55. Subsequently, an etching-back is performed to remove the resistance change material 56 at the bottom of the recess 55 and on the upper surface of the insulating layer 54. As a result, the upper surfaces of the silicon layer 44 and the insulating layers 58 and 47 are exposed again at the bottom of the recess 55.

Figure 34:
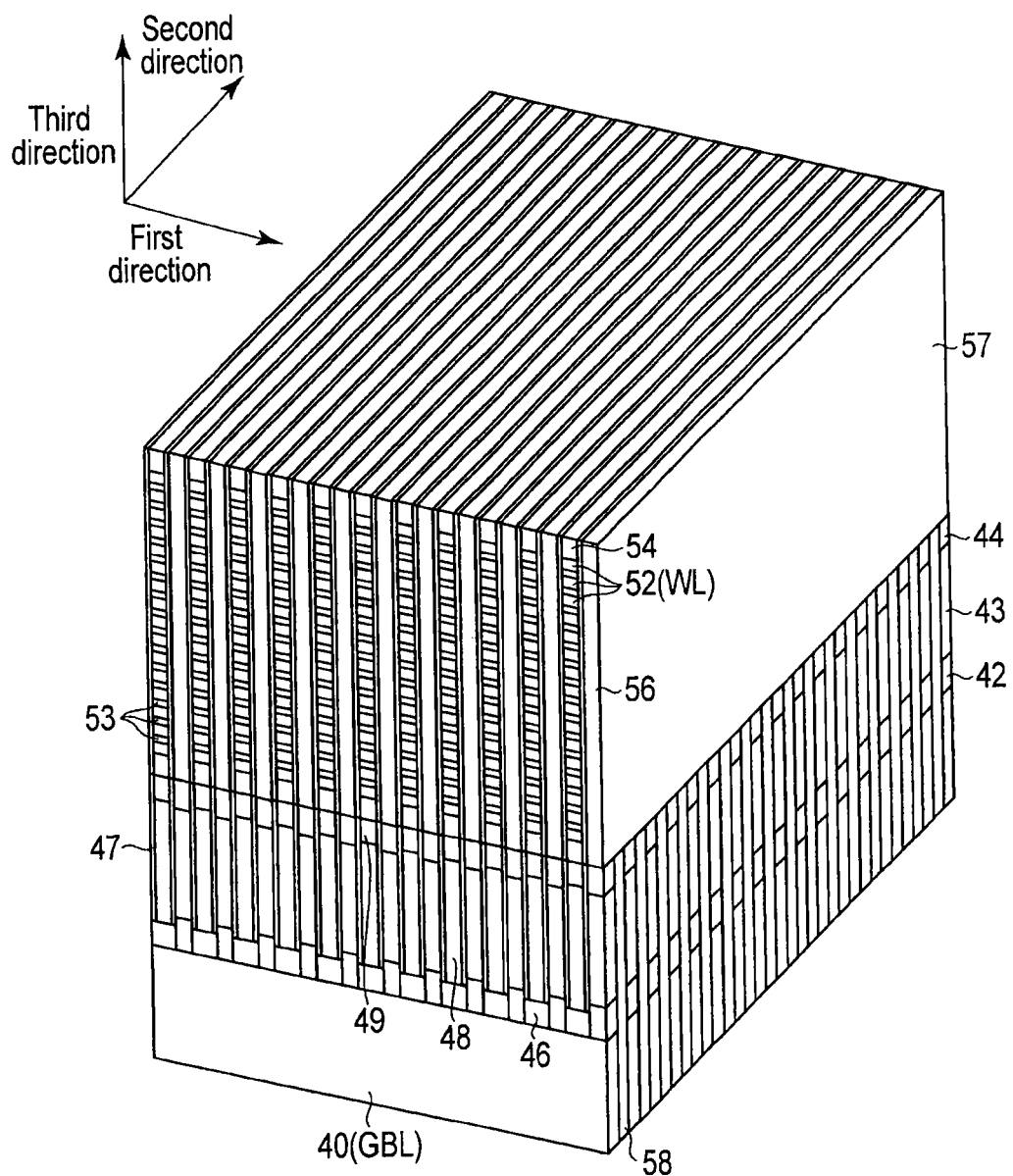

Subsequently, as illustrated in FIG. 34, a bit line film 57 is formed on an entire surface and is polished by a CMP method so that the bit line film 57 remains only within the recess 55. The bit line film 57 corresponds to the bit line BL described with reference to FIG. 1, and is formed using, for example, $n^+$ type polycrystalline silicon as a material.

Subsequently, as illustrated in FIG. 35, the bit line film 57 is patterned in a pillar shape by using a photolithography technique and an RIE technique.

The present patterning process is performed, for example, under the condition that a line width and an adjacent spacing are all about 20 nm. Also, the present process is performed such that the bit line film 57 remains on the underlying silicon layer 44. As a result of the present process, a bit line BL is completed.

Subsequently, a recess between adjacent bit lines BL is filled with an interlayer insulating layer, and a memory cell region R1 is completed. Subsequently, as in a typical semiconductor device, a passivation process is performed, and an interconnection connecting portion, which will be an input/output unit, is further formed. Finally, the above-described storage device is completed by performing a so-called post-process, such as an inspection, a dicing, or the like.

7. CONCLUSION

According to the present embodiment, in the three-dimensional storage device, which is easy to manufacture and can be highly integrated, high performance can be achieved by suppressing the threshold value shift of the select transistor.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
a first conductive line extending in a first direction;
second conductive lines each extending in a second direction intersect with the first direction;
a third conductive line extending in a third direction intersect with the first and second directions;
resistance change elements connected between the second conductive lines and the third conductive line respectively;
a semiconductor layer connected between the first conductive line and one end of the third conductive line;
a select FET having a select gate electrode, and using the semiconductor layer as a channel; and
a control circuit which is configured to execute a set/reset of at least one of the resistance change elements, and execute a recovering operation which adjusts a threshold voltage shift of the select FET by setting the first conductive line to a first potential, setting the select gate electrode to a second potential, setting all of the second conductive lines connected with the resistance change elements to a single third conductive line to a third potential, and setting at least one of the first potential or the third potential to higher than the second potential, after the set/reset.

2. The device of claim 1,
wherein the first and third potentials are different from each other.

3. The device of claim 2,
wherein a direction of a current flowing in the recovering operation is the same as a direction of a current which flows to the select FET in the set/reset.

4. The device of claim 1,
wherein the first and third potentials are equal to each other.

5. The device of claim 1,
wherein the first potential is equal to a potential of the first conductive line in the set/reset.

6. The device of claim 1,
wherein the second potential is smaller than a potential of the select gate electrode in the set/reset.

7. The device of claim 6,
wherein the second potential is a ground potential.

8. The device of claim 1,
wherein the third potential is different from a potential of a selected conductive line among the second conductive lines and a potential of each of unselected conductive lines among the second conductive lines in the set/reset.

9. The device of claim 1,
wherein a potential difference between the first and third potentials is larger than a potential difference between a potential of the first conductive line and a potential of each of unselected conductive lines among the second conductive lines in the set/reset.

10. The device of claim 1, further comprising:
a current detection circuit connected to the first conductive line,
wherein the control circuit is configured to change a condition of the recovering operation based on an output value of the current detection circuit.

11. A method of controlling a memory device,
the device comprising:
a first conductive line extending in a first direction;
second conductive lines each extending in a second direction intersect with the first direction;
a third conductive line extending in a third direction intersect with the first and second directions;
resistance change elements connected between the second conductive lines and the third conductive line respectively;
a semiconductor layer connected between the first conductive line and one end of the third conductive line; and
a select FET having a select gate electrode, and using the semiconductor layer as a channel,
the method comprising:
executing a set/reset of at least one of the resistance change elements; and
executing a recovering operation which adjusts a threshold voltage shift of the select FET by setting the first conductive line to a first potential, setting the select gate electrode to a second potential, setting all of the second conductive lines connected with the resistance change elements to a single third conductive line to a third potential, and setting at least one of the first potential or the third potential to higher than the second potential, after the set/reset.

12. The method of claim 11, wherein the first and third potentials are different from each other, and the recovering operation is executed by flowing a current to the select FET.

13. The method of claim 12, wherein a direction of the current is the same as a direction of a current which flows to the select FET in the set/reset.

14. The method of claim 11, wherein the first and third potentials are equal to each other.

15. The method of claim 11, wherein the first potential is equal to a potential of the first conductive line in the set/reset.

16. The method of claim 11, wherein the second potential is smaller than a potential of the select gate electrode in the set/reset.

17. The method of claim 16, wherein the second potential is a ground potential.

18. The method of claim 11, wherein the third potential is different from a potential of a selected conductive line among the second conductive lines and a potential of each of unselected conductive lines among the second conductive lines in the set/reset.

19. The method of claim 11, wherein a potential difference between the first and third potentials is larger than a potential difference between a potential of the first conductive line and a potential of each of unselected conductive lines among the second conductive lines in the set/reset.

20. The method of claim 11, further comprising: changing a condition of the recovering operation based on an output value of a current detection circuit connected to the first conductive line.

* * * * *